(12) United States Patent
Kamochi et al.

(10) Patent No.: US 10,580,640 B2
(45) Date of Patent: Mar. 3, 2020

(54) KIT AND LAMINATE

(71) Applicant: FUJIFILM Corporation, Tokyo (JP)

(72) Inventors: Yoshitaka Kamochi, Shizuoka (JP); Yu Iwai, Shizuoka (JP); Ichiro Koyama, Shizuoka (JP); Atsushi Nakamura, Zwijndrecht (BE)

(73) Assignee: FUJIFILM Corporation, Tokyo (JP)

( * ) Notice: Subject to any disclaimer, the term of this patent is extended or adjusted under 35 U.S.C. 154(b) by 130 days.

(21) Appl. No.: 15/712,595

(22) Filed: Sep. 22, 2017

(65) Prior Publication Data

US 2018/0012751 A1 Jan. 11, 2018

Related U.S. Application Data

(63) Continuation of application No. PCT/JP2016/057905, filed on Mar. 14, 2016.

(30) Foreign Application Priority Data

Mar. 23, 2015 (JP) .................. 2015-060077

(51) Int. Cl.
*H01L 21/02* (2006.01)
*C09J 121/00* (2006.01)
(Continued)

(52) U.S. Cl.
CPC .............. *H01L 21/022* (2013.01); *C09J 5/06* (2013.01); *C09J 121/00* (2013.01); *C09J 125/04* (2013.01);
(Continued)

(58) Field of Classification Search
CPC ............. H01L 21/022; H01L 21/02304; H01L 21/304; H01L 21/2057; H01L 21/31133;
(Continued)

(56) References Cited

U.S. PATENT DOCUMENTS

2006/0105133 A1* 5/2006 Milner ................ C09B 67/0083
428/64.1
2009/0250168 A1 10/2009 Sato et al.
(Continued)

FOREIGN PATENT DOCUMENTS

JP 2009-249514 A 10/2009
JP 2010-287723 A 12/2010
(Continued)

OTHER PUBLICATIONS

Written Opinion of the International Searching Authority dated May 24, 2016, in counterpart International Application No. PCT/JP2016/057905.
(Continued)

*Primary Examiner* — Shane Fang
(74) *Attorney, Agent, or Firm* — Sughrue Mion, PLLC

(57) ABSTRACT

Provided are a kit and a laminate which are capable of suppressing residues derived from a temporary adhesive in manufacture of a semiconductor. The kit for manufacturing a semiconductor device includes a composition which contains a solvent A; a composition which contains a solvent B; and a composition which contains a solvent C, in which the kit is used when a temporary adhesive layer is formed on a first substrate using a temporary adhesive composition containing a temporary adhesive and the solvent A, at least some of an excessive amount of the temporary adhesive on the first substrate is washed using the composition containing the solvent B, a laminate is manufactured by bonding the first substrate and a second substrate through the temporary adhesive layer, one of the first substrate and the second substrate is peeled off from the laminate at a temperature of lower than 40° C., and then the temporary adhesive remaining on at least one of the first substrate or the second substrate is washed using the composition containing the solvent C, and the solvent A, the solvent B, and the solvent (Continued)

C respectively satisfy a predetermined vapor pressure and a predetermined saturated solubility.

15 Claims, 1 Drawing Sheet

(51) Int. Cl.
  C09J 201/00    (2006.01)
  H01L 21/304    (2006.01)
  H01L 21/311    (2006.01)
  H01L 21/683    (2006.01)
  C09J 125/04    (2006.01)
  C09J 153/00    (2006.01)
  C09J 5/06      (2006.01)

(52) U.S. Cl.
  CPC .......... *C09J 153/00* (2013.01); *C09J 201/00* (2013.01); *H01L 21/02057* (2013.01); *H01L 21/02304* (2013.01); *H01L 21/304* (2013.01); *H01L 21/31133* (2013.01); *H01L 21/6835* (2013.01); *H01L 2221/6834* (2013.01); *H01L 2221/68327* (2013.01); *H01L 2221/68386* (2013.01)

(58) Field of Classification Search
  CPC ......... H01L 21/68327; H01L 21/68386; H01L 21/6834; C09J 125/04; C09J 5/06; C09J 121/00; C09J 201/00; C09J 153/00
  See application file for complete search history.

(56) References Cited

U.S. PATENT DOCUMENTS

| 2010/0314043 A1 | 12/2010 | Imai et al. |
| 2011/0240231 A1 | 10/2011 | Tamura et al. |
| 2013/0285217 A1 | 10/2013 | Yamaguchi et al. |
| 2013/0299946 A1 | 11/2013 | Takahashi et al. |
| 2015/0184033 A1 | 7/2015 | Iwai et al. |

FOREIGN PATENT DOCUMENTS

| JP | 2011-222562 A | 11/2011 |
| JP | 2013-235919 A | 11/2013 |
| JP | 2013-241568 A | 12/2013 |
| JP | 2013-258332 A | 12/2013 |
| JP | 2014-70191 A  | 4/2014 |
| TW | 201212112 A1  | 3/2012 |
| TW | 201346987 A   | 11/2013 |
| TW | 201402739 A   | 1/2014 |

OTHER PUBLICATIONS

International Preliminary Report on Patentability dated Sep. 26, 2017, in counterpart International Application No. PCT/JP2016/057905.

International Search Report for PCT/JP2016/057905 dated May 24, 2016 [PCT/ISA/210].

Office Action dated Jan. 22, 2019 from the Korean Intellectual Property Office in counterpart KR Application No. 10-2017-7026663.

Communication dated Oct. 9, 2018 by the State Intellectual Property Office of the P.R.C. in counterpart Chinese application No. 201680017383.0.

Office Action dated Jul. 11, 2019 issued by the Taiwanese Intellectual Property Office in counterpart Taiwanese application No. 105108631.

\* cited by examiner

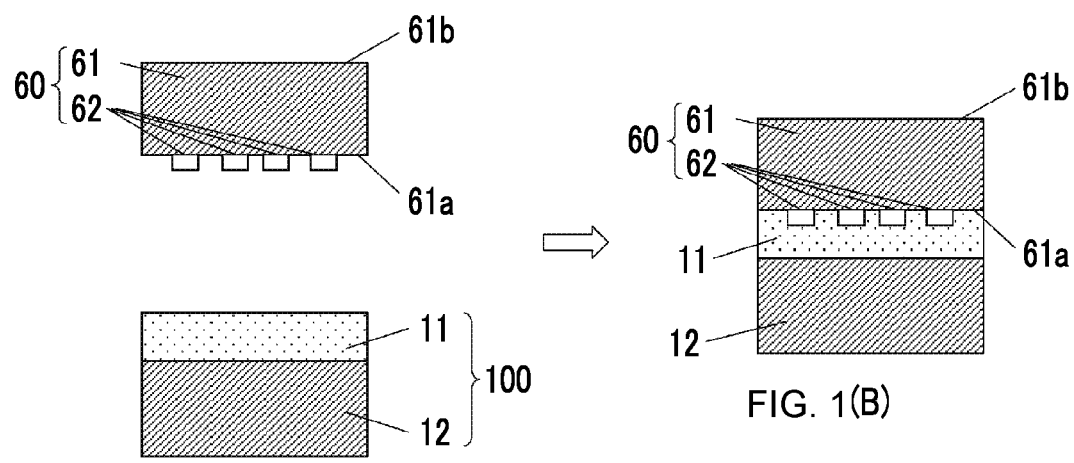
FIG. 1(A)
FIG. 1(B)
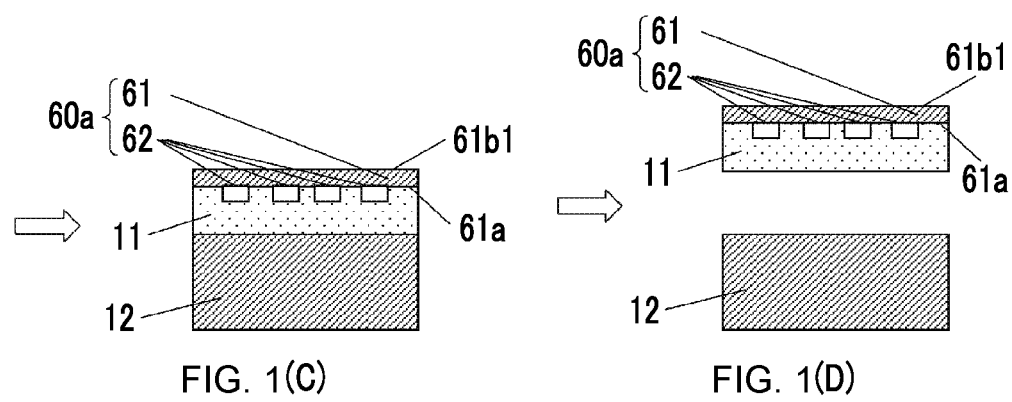
FIG. 1(C)
FIG. 1(D)
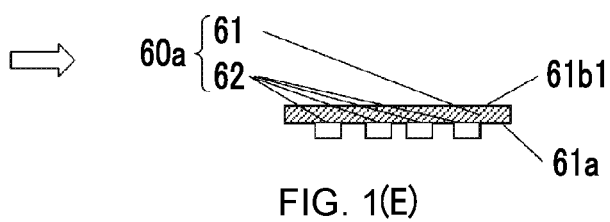
FIG. 1(E)

KIT AND LAMINATE

CROSS-REFERENCE TO RELATED APPLICATIONS

This application is a Continuation of PCT International Application No. PCT/JP2016/057905 filed on Mar. 14, 2016, which claims priority under 35 U.S.C. § 119(a) to Japanese Patent Application No. 2015-060077 filed on Mar. 23, 2015. Each of the above application(s) is hereby expressly incorporated by reference, in its entirety, into the present application.

BACKGROUND OF THE INVENTION

1. Field of the Invention

The present invention relates to a kit and a laminate. Particularly, the present invention relates to a kit used for performing processing with a temporary adhesive for a semiconductor manufacturing device.

2. Description of the Related Art

In a process of manufacturing a semiconductor device such as an integrated circuit (IC) or a large scale integrated circuit (LSI), multiple IC chips are formed on a device wafer and separated by dicing.

With the needs for further miniaturization and higher performance of electronic devices, there has been a demand for further miniaturization and higher integration of IC chips to be mounted on electronic devices.

Here, since multilayering of an integrated circuit increases the thickness of an IC chip, it is necessary to reduce the thickness of a member constituting the IC chip. As for the reduction in thickness of such a member, for example, a reduction in thickness of a device wafer has been examined.

For the above-described reason, a technique of temporarily fixing (temporary adhesion) a device substrate and a carrier substrate, before being thinned, to each other using a temporary adhesive, grinding the rear surface of the device wafer so that the device wafer is thinned, and detaching the carrier substrate off from the device substrate has been known.

Here, JP2013-241568A discloses a method of treating a base material including a step of temporarily fixing a base material onto a support through a temporary fixing member containing at least a temporary fixing member that contains a cycloolefin polymer and a compound having at least one structure selected from a diaryl silicone structure, a dialkyl silicone structure, a fluorinated alkyl structure, a fluorinated alkenyl structure, and an alkyl structure having 8 or more carbon atoms and at least one structure selected from a polyoxyalkylene structure, a structure having a phosphoric acid group, and a structure having a sulfo group to obtain a laminate, a step of processing the base material and/or moving the laminate, and a step of peeling the base material from the support by applying a force to the base material or the support in a direction substantially perpendicular to the surface of the base material in this order.

SUMMARY OF THE INVENTION

An object of JP2013-241568A is to disclose a treatment method in which breakage of a base material can be prevented when the base material is peeled off from the support.

However, as a result of research on JP2013-241568A conducted by the present inventor, it was found that the rear surface of the base material or the support and the edge portion or the bevel portion are contaminated or troubles occur in some cases when the base material is peeled off from the support in a case where the treatment method described in JP2013-241568A is used. Particularly, it was found that residues derived from the temporary adhesive greatly affect the characteristics of the device substrate.

The present invention has been made in order to solve the above-described problems, and the purpose thereof is to suppress residues derived from the temporary adhesive in the device substrate. Specifically, an object of the present invention is to provide a kit and a laminate which suppress residues derived from the temporary adhesive in manufacture of a semiconductor.

Under the above-described circumstances, as the result of the research conducted by the present inventor, it was found that a solvent used when a temporary adhesive layer is formed using a composition containing a temporary adhesive and a solvent A, a solvent used when an excessive amount of temporary adhesive on a first substrate is washed using a composition containing a solvent B, and a solvent used when one of the first substrate and a second substrate is peeled off from the laminate at a temperature of lower than 40° C. and then the temporary adhesive remaining on the first substrate or the second substrate is washed with a solvent have respectively appropriate ranges and the above-described problems can be solved by selecting a solvent suitable for each step.

Specifically, the above-described problems are solved by the following means <1> and <17>, preferably <2> to <16>, <18>, and <19>.

<1> A kit for manufacturing a semiconductor device comprising: a composition which contains a solvent A; a composition which contains a solvent B; and a composition which contains a solvent C, in which the kit is used when a temporary adhesive layer is formed on a first substrate using a temporary adhesive composition containing a temporary adhesive and the solvent A, at least some of an excessive amount of the temporary adhesive on the first substrate is washed using the composition containing the solvent B, a laminate is manufactured by bonding the first substrate and a second substrate through the temporary adhesive layer, one of the first substrate and the second substrate is peeled off from the laminate at a temperature of lower than 40° C., and then the temporary adhesive remaining on at least one of the first substrate or the second substrate is washed using the composition containing the solvent C, and the solvent A satisfies Formula 1, the solvent B satisfies Formula 2, and the solvent C satisfies Formula 3, $$\sqrt{(C_A-35)^2+(10\log P_A-27)^2} < 7.3 \qquad \text{Formula 1}$$

$$\sqrt{(C_B-31)^2+(10\log P_B-29)^2} < 5.0 \qquad \text{Formula 2}$$

$$\sqrt{(C_C-32)^2+(10\log P_C-30)^2} < 6.5 \qquad \text{Formula 3}$$

in Formulae 1 to 3, $P_A$, $P_B$, and $P_C$ each represent a vapor pressure of the solvent A, the solvent B, and the solvent C at 25° C., and $C_A$, $C_B$, and $C_C$ each represent a saturated solubility of the temporary adhesive in the solvent A, the solvent B, and the solvent C at 25° C., where the unit of the vapor pressure is Pa and the unit of the saturated solubility is % by mass.

<2> The kit according to <1>, in which when a solubility parameter of the solvent A is set as $sp_A$ and a solubility parameter of the solvent B is set as $sp_B$, an inequation of $|sp_A-sp_B| \leq 3.0$ is satisfied, where the unit of the solubility parameter is $(MPa)^{0.5}$.

<3> The kit according to <1> or <2>, in which the laminate includes one or more temporary adhesive layers on the surface of the first substrate and the second substrate on the surface of the temporary adhesive layer.

<4> The kit according to <3>, in which the temporary adhesive layer is formed of one layer.

<5> The kit according to any one of <1> to <4>, in which the temporary adhesive layer is formed by coating the first substrate with a temporary adhesive composition that contains the temporary adhesive and the solvent A.

<6> The kit according to any one of <1> to <5>, in which an excessive amount of the temporary adhesive in the laminate is present on at least one of an edge portion of the first substrate or a bevel portion of the first substrate, which is a surface of the first substrate on a side far from the second substrate.

<7> The kit according to any one of <1> to <6>, in which the composition containing the solvent A is the temporary adhesive composition containing the temporary adhesive and the solvent A.

<8> The kit according to any one of <1> to <7>, in which the temporary adhesive contains an elastomer.

<9> The kit according to <8>, in which the elastomer has a repeating unit derived from styrene.

<10> The kit according to <8> or <9>, in which the elastomer is a hydrogenated material.

<11> The kit according to any one of <8> to <10>, in which the elastomer has a styrene block at one terminal or both terminals.

<12> The kit according to any one of <1> to <11>, in which a saturated solubility $C_C$ of the solvent C at 25° C. is in a range of 26 to 35% by mass.

<13> The kit according to any one of <1> to <12>, in which the solvent A, the solvent B, and the solvent respectively include hydrocarbons having at least one of an alicycle or an aromatic ring.

<14> The kit according to any one of <1> to <13>, in which a boiling point of each of the solvents A to C at 101300 Pa at 25° C. is in a range of 155° C. to 206° C.

<15> The kit according to any one of <1> to <14>, in which 90% by mass or greater of the composition containing the solvent A is formed of the solvent A.

<16> The kit according to any one of <1> to <15>, in which 90% by mass or greater of the composition containing the solvent B is formed of the solvent B, and 90% by mass or greater of the composition containing the solvent C is formed of the solvent C.

<17> A laminate for manufacturing a semiconductor device comprising, in order: a first substrate; a temporary adhesive layer which contains a temporary adhesive; and a second substrate, in which one or more temporary adhesive layers are provided on a surface of the first substrate, the second substrate is provided on a surface of the temporary adhesive layer, and the temporary adhesive layer contains a solvent A, and the following formula is satisfied when a vapor pressure of the solvent A at 25° C. is set as $P_A$ and a saturated solubility of the temporary adhesive in the solvent A at 25° C. is set as $C_A$, $$\sqrt{(C_A-35)^2+(10\log P_A-27)^2}<7.3;$$

where the unit of the vapor pressure is Pa and the unit of the saturated solubility is % by mass.

<18> The laminate according to <17>, in which the content of each of Na, K, Ca, Fe, Cu, Mg, Mn, Al, Pb, Ni, Cr, Sn, and Zn in the temporary adhesive layer is 0.01% by mass or less.

<19> The laminate according to <17> or <18>, in which the total content of the solvent A or a solvent B in the temporary adhesive layer is in a range of 0.000001% to 0.1% by mass.

In manufacture of a semiconductor, it is possible to provide a kit and a laminate which are capable of suppressing residues derived from a temporary adhesive.

BRIEF DESCRIPTION OF THE DRAWING

FIG. 1(A) to FIG. 1(E) are views schematically illustrating an example of a method of manufacturing a semiconductor device.

DESCRIPTION OF THE PREFERRED EMBODIMENTS

Hereinafter, the present invention will be described in detail.

In regard to notation of a group (atomic group) in the present specification, in a case where it is not noted whether a group includes a substituent or not, it means that a group with a substituent and a group without a substituent are both included. For example, when an "alkyl group" is noted, an alkyl group without a substituent (unsubstituted alkyl group) as well as an alkyl group with a substituent (substituted alkyl group) are included.

Further, "active rays" or "radiation" in the present specification includes visible light rays, ultraviolet rays, fat-ultraviolet rays, electron beams, and X-rays.

In the present specification, "light" indicates active rays or radiation.

In the present specification, unless otherwise specified, the concept of "exposure" includes not only exposure using far-ultraviolet rays, X-rays, extreme ultraviolet rays (EUV) typified by a mercury lamp, ultraviolet rays, and an excimer laser but also exposure using particle rays such as electron beams and ion beams.

In the present specification, "(meth)acrylate" indicates acrylate and methacrylate, "(meth)acryl" indicates acryl and methacryl, and "(meth)acryloyl" indicates "acryloyl" and "methacryloyl".

In the present specification, the weight-average molecular weight and the number average molecular weight are defined as a value obtained by gel permeation chromatography (GPC) measurement in terms of polystyrene. In the present specification, a weight-average molecular weight (Mw) and a number average molecular weight (Mn) can be acquired, for example, using an HLC-8220 (manufactured by TOSOH CORPORATION), a TSKgel Super AWM-H (inner diameter of 6.0 mm ID×15.0 cm, manufactured by TOSOH CORPORATION) as a column, and a 10 mmol/L lithium bromide NMP (N-methylpyrrolidone) solution as an eluant.

Hereinafter, in embodiments described below, members or the like which have been already described with reference to the referenced drawings are denoted by the same reference numerals or the corresponding numerals and the description thereof is simplified or omitted.

Kit

A kit for manufacturing a semiconductor of the present invention includes a composition which contains a solvent A; a composition which contains a solvent B; and a composition which contains a solvent C, in which the kit is used when a temporary adhesive layer is formed on a first substrate using a temporary adhesive composition containing a temporary adhesive and the solvent A, at least some of an excessive amount of the temporary adhesive on the first substrate is washed using the composition containing the solvent B, a laminate is manufactured by bonding the first substrate and a second substrate through the temporary adhesive layer, and one of the first substrate and the second substrate is peeled off from the laminate at a temperature of lower than 40° C., and then the temporary adhesive remaining on at least one of the first substrate or the second substrate is washed using the composition containing the solvent C, and the solvent A satisfies Formula 1, the solvent B satisfies Formula 2, and the solvent C satisfies Formula 3.

$$\sqrt{(C_A-35)^2+(10\log P_A-27)^2}<7.3 \qquad \text{Formula 1}$$

$$\sqrt{(C_B-31)^2+(10\log P_B-29)^2}<5.0 \qquad \text{Formula 2}$$

$$\sqrt{(C_C-32)^2+(10\log P_C-30)^2}<6.5 \qquad \text{Formula 3}$$

In Formulae 1 to 3, $P_A$, $P_B$, and $P_C$ each independently represent a vapor pressure of the solvent A, and the solvent B, and the solvent C at 25° C., and $C_A$, $C_B$, and $C_C$ each independently represent a saturated solubility of the temporary adhesive in the solvent A, the solvent B, and the solvent C at 25° C., where the unit of the vapor pressure is Pa and the unit of the saturated solubility is % by mass.

With the above-described configuration, appropriate solvents for the step of forming the temporary adhesive layer, the step of washing an excessive amount of temporary adhesive on the first substrate, and the step of peeling the first substrate and the second substrate off from the laminate and residues derived from the temporary adhesive can be effectively suppressed. Particularly, in the technical field of the present invention, substantially no examination on solvents used for the step of forming the temporary adhesive layer and the step of peeling the temporary adhesive layer has been made. Further, the step of washing an excessive amount of temporary adhesive on the first substrate has not been examined. However, it was found that residues derived from the temporary adhesive are generated and then the residues greatly affect a device substrate to be obtained in a case where the solvents used for each step are not appropriate. In the present invention, such problems were found and this is technically meaningful.

In the present invention, either of the step of washing the excessive amount of temporary adhesive on the first substrate using the composition containing the solvent B and the step of manufacturing a laminate by bonding the first substrate and the second substrate to each other through the temporary adhesive layer may be performed first.

Further, the step of washing the excessive amount of temporary adhesive on the first substrate using the composition containing the solvent B may be performed before and after the step of manufacturing a laminate by bonding the first substrate and the second substrate to each other through the temporary adhesive layer.

In the present invention, the vapor pressures of the solvent A, the solvent B, and the solvent C at 25° C. and the saturated solubilities of the solvent A, the solvent B, and the solvent C of the temporary adhesive at 25° C. satisfy Formulae 1 to 3. Formula 1 means that a solvent which fully dissolves the temporary adhesive and is unlikely to be dried to obtain a film which is uniform throughout the entire surface of the substrate has been selected because the solvent A is used to dissolve the temporary adhesive and form a temporary adhesive layer having a desired film thickness. Formula 2 means that a solvent which slightly dissolves the temporary adhesive and is easily dried for the purpose of preventing excessive penetration into the temporary adhesive has been selected because the solvent B is used to wash the excessive amount of temporary adhesive on the first substrate. Further, Formula 3 means that a solvent which fully dissolves the temporary adhesive and is easily dried has been selected because the solvent C is used to wash unnecessary residues of the temporary adhesive remaining on the first substrate and the second substrate after one of the first substrate and the second substrate is peeled off from the laminate.

Here, Pa which has been typically used by those skilled in the art is selected as the unit of the vapor pressure of a solvent and "% by mass" which has been typically used by those skilled in the art is selected as the unit of the saturated solubility of the temporary adhesive. Here, for the purpose of aligning digits of significant figures of numerical values to some extent in the vapor pressures of solvents and the saturated solubilities of the temporary adhesive, the atmospheric pressure is set to 10 log P.

After various solvents have been widely examined, it was confirmed that an excellent device substrate is obtained within the ranges of Formulae 1 to 3 described above by using solvents exhibiting particularly excellent performance for each of the solvent A used for the step of forming the temporary adhesive layer, the solvent B used for the step of washing the excessive amount of temporary adhesive on the first substrate, and the solvent C used for the step of peeling one of the first substrate and the second substrate from the laminate and performing tests using other solvents.

Here, the lower limit of the value (value on the left side of Formula 1) in Formula 1 is preferably 3.0 or greater.

Here, the value (value on the right side of Formula 2) in Formula 2 is preferably 1.0 or greater, more preferably 2.6 or greater, still more preferably 3.0 or greater, and particularly preferably 3.5 or greater.

Here, the value (value on the right side of Formula 3) in Formula 3 is preferably 2.3 or greater, more preferably 3.5 or greater, and still more preferably 4.0 or greater.

Laminate

The laminate of the present invention includes the first substrate, the temporary adhesive layer on the first substrate, and the second substrate in this order.

Preferably, the laminate of the present invention includes one or more temporary adhesive layers on the surface of the first substrate and the second substrate on the surface of the temporary adhesive layer. More preferably, the temporary adhesive layer is formed of one layer, for example, a monolayer.

In addition, the laminate of the present invention may include other layers between the first substrate and the temporary adhesive layer and/or the temporary adhesive layer and the second substrate. Examples of other layers include a layer (also referred to as a separation layer or a release layer) that facilitates the peeling of the temporary adhesive layer off from the first or second substrate. Examples of the layer that facilitates the peeling of the temporary adhesive layer off from the first or second substrate include a layer which is modified when irradiated with light or heat and separates the temporary adhesive layer from the first or the second substrate and a layer which is easily dissolved in a specific solvent and peels a device substrate and a fixing member off from each other by being immersed in a specific solvent after the device substrate of the laminate is thinned. As the peeling layer, the description in paragraphs 0025 to 0055 of JP2014-212292A can be referred to and the contents thereof are incorporated in the present specification. Further, as the separation layer, the description in paragraphs [0069] to [0124] of WO2013/065417A can be referred to and the contents thereof are incorporated in the present specification.

It is preferable that the first substrate of the present invention is a device wafer to be thinned and the second substrate is a carrier substrate. It is preferable that the device wafer is fixed to the carrier substrate through the temporary adhesive layer so that the device wafer is thinned.

Examples of the carrier substrate include various wafers such as a silicon wafer, a SiC wafer, and a GaN wafer; substrates made of various materials such as glass and an organic base material; and substrates on which an organic film or an inorganic film is formed. The thickness of the carrier substrate is not particularly limited, but is preferably in a range of 300 μm to 100 mm and more preferably in a range of 300 μm to 10 mm.

As the device wafer, known device wafers can be used without limitation and examples of the known wafers include a silicon substrate and a compound semiconductor substrate. Specific examples of the compound semiconductor substrate include a SiC substrate, a SiGe substrate, a ZnS substrate, a ZnSe substrate, a GaAs substrate, an InP substrate, and a GaN substrate.

A mechanical structure or a circuit may be formed on the surface of a device wafer. Examples of the device wafer on which a mechanical structure or a circuit is formed include micro electro mechanical systems (MEMS), a power device, an image sensor, a microsensor, a light emitting diode (LED), an optical device, an interposer, an implantable device, and a microdevice.

It is preferable that the device wafer has a structure of a metal bump or the like. According to the present invention, temporary adhesion can be stably carried out with respect to a device wafer whose surface has a structure and the temporary adhesion with respect to the device wafer can be easily released. The height of the structure is not particularly limited, but is preferably in a range of 1 to 150 μm and more preferably in a range of 5 to 100 μm.

Preferably, the laminate of the present invention is a laminate for manufacturing a semiconductor device including the first substrate; the temporary adhesive layer which contains a temporary adhesive; and the second substrate in this order, in which one or more temporary adhesive layers are provided on a surface of the first substrate, the second substrate is provided on a surface of the temporary adhesive layer, and the temporary adhesive layer contains a solvent A, and the following formula is satisfied in a case where the vapor pressure of the solvent A at 25° C. is set as $P_A$ and a saturated solubility of the temporary adhesive in the solvent A at 25° C. is set as $C_A$. Such a laminate is obtained according to the method of manufacturing a laminate.

$$\sqrt{(C_A-35)^2+(10\log P_A-27)^2}<7.3;$$

Here, the unit of the vapor pressure is Pa and the unit of the saturated solubility is % by mass.

In the laminate of the present invention, the content of a metal component in the laminate is preferably 0.01% by mass or less, more preferably 0.005% by mass or less, and still more preferably 0.001% by mass or less. The lower limit of the content of the metal component in the laminate is not particularly limited and may be set to 0% by mass. For example, it is advantageous that the content thereof is set to 0.00001% by mass or greater from the viewpoint that components that oxidize or modify a resin such as a small amount of moisture or oxygen present in the resin can be captured.

The total content of the solvent A and the solvent B in the temporary adhesion layer of the laminate of the present invention is preferably in a range of 0.0000001% to 0.5% by mass and more preferably in a range of 0.000001% to 0.1% by mass. The lower limit of the total content of the solvent A and the solvent B in the temporary adhesion layer is not particularly limited and may be set to 0% by mass or greater, but solvents typically remain therein. Further, it is advantageous that the lower limit of the total content of the solvent A and the solvent B in the temporary adhesion layer is set to 0.00001% by mass or greater from the viewpoint that washing of the temporary adhesive that remains on at least one of the first substrate or the second substrate is accelerated in the step of washing the temporary adhesive using the composition containing the solvent C.

Method of Manufacturing Semiconductor Device

Hereinafter, the method of manufacturing a laminate will be described with reference to an example of a method of manufacturing a semiconductor device on which a step of manufacturing a laminate has been performed. The method will be described with reference to FIG. 1, but the present invention is not limited to the following embodiments.

FIGS. 1(A) to 1(E) are respectively cross-sectional views (FIGS. 1(A) and 1(B)) schematically describing temporary adhesion between the first substrate (for example, a carrier substrate) and the second substrate (for example, a device wafer); a cross-sectional view (FIG. 1(C)) schematically illustrating a state in which the second substrate temporarily adhering the first substrate is thinned; a cross-sectional view (FIG. 1(D)) schematically illustrating a state in which the first substrate and the second substrate are peeled off from each other; and a cross-sectional view (FIG. 1(E)) schematically illustrating a state in which the temporary adhesive has been washed away from the device wafer.

In the present embodiment, a temporary adhesive layer 11 is formed on a first substrate 12 using the composition containing the temporary adhesive and the solvent A as illustrated in FIG. 1(A). It is preferable that the temporary adhesive layer is formed by being coated with the temporary adhesive composition containing the temporary adhesive and the solvent A. According to a method of manufacturing a temporary adhesive layer, it is preferable that the temporary adhesive layer is manufactured by coating the surface of the first substrate with the temporary adhesive composition in the form of a layer and drying the solvent.

Examples of applying the temporary adhesive composition include a spin coating method, a blade coating method, a spray method, a roller coating method, a flow coating method, a doctor coating method, a screen printing method, and a dip coating method. Among these, a spin coating method and a blade coating method are preferable.

The coating amount of the temporary adhesive composition varies depending on the intended purpose thereof, but it is preferable that the coating amount thereof is set such that the average film thickness of the temporary adhesive layer after being dried is set to be in a range of 0.1 to 500 μm. The lower limit thereof is preferably 1 μm or greater. The upper limit thereof is preferably 200 μm or less and more preferably 100 μm or less.

Further, in the present invention, the average film thickness of the temporary adhesive layer is defined as an average value of the values obtained by measuring the film thickness at five places at equal intervals using a micrometer from one end surface toward the other end surface in the cross section along one direction of the temporary adhesive layer. Further, in the present invention, the "cross section along one direction of the temporary adhesive layer" is a cross section orthogonal to a long side direction in a case where the temporary adhesive layer has a polygonal shape. Further, the "cross section along one direction of the temporary adhesive layer" is a cross section orthogonal to any one side in a case where the temporary adhesive layer has a square shape. Further, the "cross section along one direction of the temporary adhesive layer" is a cross section passing through the center of gravity in a case where the temporary adhesive layer has a circular shape or an elliptical shape.

The drying conditions vary depending on the type of the temporary adhesive composition or the film thickness of the temporary adhesive layer. It is preferable that the drying is performed under a temperature condition of 60° C. to 250° C. for 10 to 600 seconds. The drying temperature is more preferably in a range of 80° C. to 200° C. The drying time is more preferably in a range of 30 to 500 seconds and still more preferably in a range of 40 to 400 seconds.

The drying may be performed by gradually increasing the temperature in two stages. For example, the temporary adhesive layer is heated in a temperature range of 80° C. to 160° C. for 30 seconds to 250 seconds and then the temporary adhesive layer is heated in a temperature range of 170° C. to 250° C. for 30 seconds to 250 seconds.

Hereinafter, the resultant obtained by forming the temporary adhesive layer 11 on the obtained first substrate 12 is referred to as an adhesive support 100.

The temporary adhesive layer 11 typically contains a small amount of solvent A and the details thereof will be described later.

A second substrate 60 is, for example, a device substrate and the second substrate obtained by providing a plurality of device chips 62 on a surface 61a of a silicon substrate 61 is exemplified.

The thickness of the device substrate is preferably in a range of 200 to 1200 µm. It is preferable that the device chip 62 is a metal structure and the height of the structure is preferably in a range of 10 to 100 µm.

Next, the step of washing the excessive amount of temporary adhesive on the first substrate using the composition containing the solvent B and the step of manufacturing a laminate by bonding the first substrate and the second substrate to each other through the temporary adhesive layer are performed. Either of these steps may be performed first.

Further, the step of washing the excessive amount of temporary adhesive on the first substrate using the composition containing the solvent B may be performed before and after the step of manufacturing a laminate by bonding the first substrate and the second substrate to each other through the temporary adhesive layer.

First, the step of washing at least some of an excessive amount of the temporary adhesive on the first substrate using the composition containing the solvent B will be described. The excessive amount of the temporary adhesive on the first substrate is present on at least one of an edge portion of the first substrate or a bevel portion of the first substrate, which is a surface (rear surface) of the first substrate on a side far from the second substrate. Generation of residues derived from the temporary adhesive can be suppressed by washing the excessive amount of temporary adhesive using the composition containing the solvent B. The details of the solvent B will be described later.

Next, the step of manufacturing a laminate by bonding the first substrate and the second substrate through the temporary adhesive layer will be described.

In the present step, as illustrated in FIG. 1(B), the adhesive support 100 obtained by forming the temporary adhesive layer 11 on the first substrate 12 is crimped to the second substrate 60 and then the first substrate 12 and the second substrate 60 temporarily adhere to each other. As for the conditions for the pressing and adhering, for example, it is preferable that the temperature is in a range of 100° C. to 210° C., the pressure is in a range of 0.01 to 1 MPa, and the time is in a range of 20 seconds to 15 minutes.

It is preferable that the device chip 62 is completely covered with the temporary adhesive layer 11 and the relationship of "X+100≥Y>X" is satisfied in a case where the height of the device chip is set to X µm and the thickness of the temporary adhesive layer is set to Y µm.

The complete coverage of the device chip 62 with the temporary adhesive layer 11 is effective in a case where the total thickness variation (TTV) of the thin device wafer is expected to be further decreased (that is, in a case where the flatness of the thin device wafer is expected to be further improved).

In other words, at the time of reduction of the thickness of the device wafer, an uneven shape can be almost eliminated from the surface in a state where a plurality of device chips 62 are in contact with the first substrate 12 by protecting the plurality of device chips 62 with the temporary adhesive layer 11. Therefore, even when the device wafer is thinned in a state of the laminate formed by bonding the first substrate and the second substrate through the temporary adhesive layer, the possibility that the shape derived from the plurality of device chips 62 is transferred to a rear surface 61b1 of the thinned device wafer is decreased. As the result, the TTV of the thinned device wafer to be finally obtained can be further reduced.

Next, a mechanical or chemical treatment (the treatment is not particularly limited, and examples thereof include a thinning treatment such as gliding or chemical and mechanical polishing (CMP), a treatment under a high temperature condition in a vacuum such as chemical vapor deposition (CVD) or physical vapor deposition (PVD), a treatment using chemicals such as an organic solvent, an acidic treatment liquid, and a basic treatment liquid, a plating treatment, irradiation with active rays, a heat treatment, and a cooling treatment) is performed on a rear surface 61b of the first silicon substrate 61 as illustrated in FIG. 1(C), and then the thickness of the silicon substrate 61 is reduced (for example, the average thickness is preferably less than 500 µm and more preferably in a range of 1 to 200 µm) as illustrated in FIG. 1(C), thereby obtaining a thin device wafer.

In addition, as the mechanical or chemical treatment, a treatment of forming a through-hole (not illustrated) penetrating the silicon substrate from the rear surface 61b1 of the thin device wafer and then forming a silicon through-electrode (not illustrated) in the through-hole may be performed after the treatment of reducing the thickness.

Further, in the mechanical or chemical treatment, the highest temperature during the heat treatment is preferably in a range of 130° C. to 400° C. and more preferably in a range of 180° C. to 350° C. It is preferable that the highest temperature during the heat treatment is set to be lower than the decomposition temperature of the temporary adhesive film. It is preferable that the heat treatment is performed by heating the surface at the highest temperature for 30 seconds to 30 minutes and more preferable that the heat treatment is performed by heating the surface at the highest temperature for 1 minute to 10 minutes.

Next, one of the first substrate and the second substrate is peeled off at a temperature of lower than 40° C. For example, as illustrated in FIG. 1(D), the first substrate 12 is peeled off from the thinned second substrate 60a. Here, it is preferable that the peeling is performed at a temperature of lower than 40° C., that is, under the condition that heating or the like is not performed. The upper limit of the temperature at the time of peeling is preferably 38° C. or lower. The lower limit of the temperature at the time of peeling is preferably 10° C. or higher and more preferably 20° C. or higher.

The method of peeling is not particularly limited, but it is preferable that the first substrate 12 is peeled off by pulling the end portion up to the direction perpendicular to the surface of the thinned second substrate from the end portion of the second substrate 60a thinned without being subjected to any treatment. At this time, it is preferable that the peeling is performed at the interface between the first substrate 12 and the temporary adhesive layer 11. The pulling speed during the peeling is preferably in a range of 30 to 70 mm/min and more preferably in a range of 40 to 60 mm/min. In this case, it is preferable that a peeling strength A at the interface between the first substrate 12 and the temporary adhesive layer 11 and a peeling strength B between the surface 61a of the device wafer and the temporary adhesive layer 11 satisfy Formula 4.

$$A<B \quad \text{Formula (4)}$$

Further, the force of pulling the end portion during the peeling is preferably 1 N/mm or less and more preferably 0.5 N/mm or less. The lower limit is preferably 0.03 N/mm or greater. The force during the peeling can be measured using a force gauge.

Further, the peeling can be performed by bringing a peeling solution into contact with the temporary adhesive layer 11, sliding the second substrate 60a on the first substrate 12, and then pulling the end portion up to the direction perpendicular to the device wafer from the end portion of the second substrate 60a.

Next, the temporary adhesive remaining on the device wafer side of the first substrate or the second substrate is washed using the composition containing the solvent C. Generation of residues derived from the temporary adhesive can be suppressed by washing the temporary adhesive remaining on the device wafer side. The details of the solvent C will be described later.

In FIG. 1, the embodiment in which the first substrate is a support and the temporary adhesive layer is formed on the surface 61a thereof has been mainly described, but an embodiment in which the first substrate is a device wafer and the temporary adhesive layer is provided on the surface thereof is also included in the scope of the present invention.

Kit

The kit of the present invention includes the composition containing the solvent A, the composition containing the solvent B, and the composition containing the solvent C.

As the first embodiment of the kit of the present invention, the form in which the composition containing the solvent A is a temporary adhesive composition containing the temporary adhesive and the solvent A is exemplified. In the present embodiment, preferably 90% by mass or greater of the composition containing the solvent B, more preferably 95% by mass or greater thereof, and still more preferably 99% by mass or greater thereof is formed of the solvent B, and preferably 90% by mass or greater of the composition containing the solvent C, more preferably 95% by mass or greater thereof, and still more preferably 99% by mass or greater thereof is formed of the solvent C. The kit of the present embodiment can be used as it is for a step of temporarily adhering a fixing member and the device wafer to each other in order to make the device substrate thinner during the processing of the semiconductor device.

As a second embodiment of the kit of the present invention, the form in which 90% by mass or greater of the composition containing the solvent A is formed of the solvent A is exemplified. In the present embodiment, it is preferable that 90% by mass or greater of the composition containing the solvent B is formed of the solvent B and 90% by mass or greater of the composition containing the solvent C is formed of the solvent C. Such a kit is useful as a set combining solvents used in the semiconductor process. At the time of using the kit, it is preferable that the temporary adhesive is blended with the composition containing the solvent A as appropriate and then used. The kit of the second embodiment is preferably used in a case where solvents are added immediately before the temporary adhesion step.

In the kit of the present invention, each of the composition containing the solvent A, the composition containing the solvent B, and the composition containing the solvent C may be formed of only the solvent A, the solvent B, and the solvent C or may contain other components.

In a case where the composition containing the solvent A is the temporary adhesive composition containing the temporary adhesive and the solvent A, components other than the temporary adhesive and the solvents are the same as the components described in the section of the temporary adhesive composition below and the preferable ranges are the same as the preferable ranges of the temporary adhesive composition.

Further, as other components which may be contained in the composition containing the solvent B and the composition containing the solvent C, a surfactant, an antioxidant, and the like may be exemplified. As the details of the surfactant and the antioxidant, the description of surfactants and antioxidants which may be contained in the temporary adhesive composition described below can be referred to.

<Solvent>

The kit used in the present invention includes the composition containing the solvent A, the composition containing the solvent B, and the composition containing the solvent C as described above. In a case where the laminate includes the peeling layer or the like described above, the kit of the present invention may further contain a solvent or the like that dissolves the peeling layer, but it is preferable that the kit of the present invention is formed of the composition containing the solvent A, the composition containing the solvent B, and the composition containing the solvent C. Each of the composition containing the solvent A, the composition containing the solvent B, and the composition containing the solvent C may be formed of one solvent A, one solvent B, or one solvent C or may be formed of two or more types of solvents.

The lower limit of the vapor pressure $P_A$ of the solvent A is preferably 100 Pa or greater, more preferably 130 Pa or greater, still more preferably 200 Pa or greater, and even still more preferably 280 Pa or greater.

The upper limit thereof is preferably 700 Pa or less, more preferably 410 Pa or less, still more preferably 400 Pa or less, and even still more preferably 340 Pa or less.

The lower limit of the vapor pressure $P_B$ of the solvent B is preferably 200 Pa or greater and more preferably 240 Pa or greater. The upper limit thereof is preferably 1800 Pa or less, more preferably 620 Pa or less, and still more preferably 420 Pa or less.

The lower limit of the vapor pressure $P_C$ of the solvent C is preferably 210 Pa or greater and more preferably 280 Pa or greater. The upper limit thereof is preferably 1800 Pa or less, more preferably 620 Pa or less, still more preferably 420 Pa or less, and even still more preferably 360 Pa or less.

It is preferable that each of the solvent A, the solvent B, and the solvent C used in the present invention satisfies a predetermined solubility parameter. Here, the solubility parameter is referred to as a "solubility parameter value" or an "SP value" and is a value defined by the regular solution theory introduced by Hildebrand. The solubility parameter can be acquired by calculation. The unit of the solubility parameter is $(MPa)^{1/2}$.

In a case where a solubility parameter of the solvent A is set as $sp_A$, the lower limit is preferably 14.0 or greater and more preferably 17.0 or greater. The upper limit thereof is preferably 20.0 or less and more preferably 18.4 or less.

In a case where a solubility parameter of the solvent B is set as $sp_B$, the lower limit is preferably 14.5 or greater, more preferably 16.0 or greater, and still more preferably 17.0 or greater. The upper limit thereof is preferably 18.5 or less and more preferably 18.3 or less.

In a case where a solubility parameter of the solvent C is set as $sp_C$, the lower limit is preferably 14.5 or greater and more preferably 17.0 or greater. The upper limit thereof is preferably 20.0 or less, more preferably 19.0 or less, and still more preferably 18.5 or less.

Further, when the solubility parameter of the solvent A is set as $sp_A$ and the solubility parameter of the solvent B is set as $sp_B$, preferably an inequation of $|sp_A-sp_B|\leq3.0$, more preferably an inequation of $|sp_A-sp_B|<3.0$, still more preferably an inequation of $|sp_A-sp_B|\leq2.0$, and even still more preferably an inequation of $|sp_A-sp_B|\leq1.0$ are satisfied. Further, the lower limit of $|sp_A-sp_B|$ is preferably 0.0 or greater. When the value of $|sp_A-sp_B|$ is in the above-described range, the compatibility between the solvent A and the solvent B is increased and the rectangularity of the end portion of the temporary adhesive layer can be improved.

The boiling point of each of the solvent A, the solvent B, and the solvent C at 101300 Pa is preferably 155° C. or higher, more preferably 160° C. or higher, and still more preferably 164° C. or higher and preferably 206° C. or lower, more preferably 195° C. or lower, still more preferably 190° C. or lower, and even still more preferably 179° C. or lower.

Each of the solvent A, the solvent B, and the solvent C is preferably an organic solvent, more preferably hydrocarbons from the viewpoint of excellent solubility of a main resin of the temporary adhesive formed of hydrocarbon, still more preferably hydrocarbons containing at least one of an alicycle or an aromatic ring, and even still more preferably hydrocarbons (aromatic hydrocarbons) having at least an aromatic ring from the viewpoint of excellent solubility of the main resin of the temporary adhesive that contains an aromatic ring and has high heat resistance.

Examples of the solvents used in the present invention include esters, for example, ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, alkyl oxyacetate (such as methyl oxyacetate, ethyl oxyacetate, or butyl oxyacetate (such as methyl methoxy acetate, ethyl methoxy acetate, butyl methoxy acetate, methyl ethoxy acetate, or ethyl ethoxy acetate)), 3-oxypropionic acid alkyl esters (such as methyl 3-oxypropionate and ethyl 3-oxypropionate (such as methyl 3-methoxy propionate, ethyl 3-methoxy propionate, methyl 3-ethoxy propionate, or ethyl 3-ethoxy propionate)), 2-oxypropionic acid alkyl esters (such as methyl 2-oxypropionate, ethyl 2-oxypropionate, and propyl 2-oxypropionate (such as methyl 2-methoxy propionate, ethyl 2-methoxy propionate, propyl 2-methoxy propionate, methyl 2-ethoxy propionate, or ethyl 2-ethoxy propionate)), methyl 2-oxy-2-methyl propionate and ethyl 2-oxy-2-methyl propionate (such as methyl 2-methoxy-2-methyl propionate or ethyl 2-ethoxy-2-methyl propionate), methyl pyruvate, ethyl pyruvate, propyl pruvate, methyl acetoacetate, ethyl acetoacetate, methyl 2-oxobutanoate, ethyl 2-oxobutanonate, and 1-methoxy-2-propyl acetate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, 2-heptanone, 3-heptanone, N-methyl-2-pyrrolidone, and γ-butyrolactone; aromatic hydrocarbons such as toluene, xylene, anisole, mesitylene, pseudocumen, ethylbenzene, propylbenzene, cumene, n-butylbenzene, sec-butylbenzene, isobutylbenzene, tert-butylbenzene, amylbenzene, isoamylbenzene, (2,2-dimethylpropyl)benzene, 1-phenylhexane, 1-phenylheptane, 1-phenyloctane, 1-phenylnonane, 1-phenyldecane, cyclopropylbenzene, cyclohexylbenzene, 2-ethyltoluene, 1,2-diethylbenzene, o-cymene, indane, 1,2,3,4-tetrahydronaphthalene, 3-ethyltoluene, m-cymene, 1,3-diisopropylbenzene, 4-ethyltoluene, 1,4-diethylbenzene, p-cymene, 1,4-diisopropylbenzene, 4-tert-butyltoluene, 1,4-di-tert-butylbenzene, 1,3-diethylbenzene, 1,2,3-trimethylbenzene, 1,2,4-trimethylbenzene, 4-tert-butyl-o-xylene, 1,2,4-triethylbenzene, 1,3,5-triethylbenzene, 1,3,5-triisopropylbenzene, 5-tert-butyl-m-xylene, 3,5-di-tert-butyltoluene, 1,2,3,5-tetramethylbenzene, 1,2,4,5-tetramethylbenzene, pentamethylbenzene, and decahydronaphthalene; and aliphatic hydrocarbons such as ethyl cyclohexane, limonene (particularly, d-limonene), p-menthane, nonane, decane, dodecane, and decalin.

In the present invention, it is preferable that the solvent A is selected from mesitylene, butylbenzene, pseudocumene, and cymene. Further, it is preferable that the solvent B is selected from mesitylene, butylbenzene, pseudocumene, and cymene. Further, it is preferable that the solvent C is selected from cymene and menthane.

<Temporary Adhesive Composition>

Next, the temporary adhesive composition of the present invention will be described. The temporary adhesive composition of the present invention contains the temporary adhesive and the solvent A and may further contain other additives. The temporary adhesive composition may contain one temporary adhesive, one solvent A, and one additive or two or more kinds of temporary adhesives, solvents A, and additives.

<<Solvent>>

The temporary adhesive composition of the present invention contains the solvent A. The content of the solvent A is set such that the concentration of the total solid content in the temporary adhesive composition is preferably in a range of 5% to 90% by mass, more preferably in a range of 5% to 70% by mass, still more preferably in a range of 10% to 60% by mass, and even still more preferably in a range of 20% to 45% by mass. The temporary adhesive composition may contain only one solvent A or two or more kinds of solvents A.

In addition, the solvent A is the same as described above and the preferable ranges thereof are the same as described above.

Further, the temporary adhesive composition of the present invention may contain other solvents within the range not departing from the scope of the present invention. The content of other solvents is preferably 10% by mass or less, more preferably 5% by mass or less, and still more preferably 3% by mass or less with respect to the content of the solvent A. Further, the lower limit thereof may be 0% by mass.

<<Temporary Adhesive>>

The upper limit of a saturated solubility $C_A$ of the temporary adhesive used in the present invention in the solvent A at 25° C. is preferably 40% by mass or less, more preferably 37% by mass or less, and still more preferably 35% by mass or less. The lower limit thereof is preferably 27% by mass or greater, more preferably 28% by mass or greater, and still more preferably 30% by mass or greater.

The lower limit of a saturated solubility $C_B$ of the temporary adhesive used in the present invention in the solvent B at 25° C. is preferably 26% by mass or greater, more preferably 28% by mass or greater, and still more preferably 30% by mass or greater. The upper limit thereof is preferably 35% by mass or less and more preferably 33% by mass or less.

The lower limit of a saturated solubility $C_C$ of the temporary adhesive used in the present invention in the solvent C at 25° C. is preferably 26% by mass or greater, more preferably greater than 29% by mass, and still more preferably 29.5% by mass or greater. The upper limit thereof is preferably 40% by mass or less and more preferably 37% by mass or less.

As the temporary adhesive of the present invention, elastomers or other polymer compounds can be used and these may be used alone or in combination of two or more kinds thereof.

<<<Elastomer>>>

It is preferable that the temporary adhesive composition of the present invention contains an elastomer. The elastomer may be used alone or in combination of two or more kinds thereof.

When an elastomer is used, fine unevenness of the device wafer can be followed and the temporary adhesive layer having excellent adhesiveness can be formed using an appropriate anchor effect. The elastomer can be used alone or in combination of two or more kinds thereof. Further, when one of the first substrate and the second substrate is peeled off from the laminate, it is possible to peel the first substrate or the second substrate off from the laminate without applying stress to the substrate or the like and to prevent a device or the like on the device substrate from being damaged or peeled off.

Further, in the present specification, the elastomer indicates a polymer compound exhibiting elastic deformation. In other words, the elastomer is defined as a polymer compound which is immediately deformed due to an external force when the external force is applied and has a property of recovering the original shape in a short time when the external force is eliminated.

The weight-average molecular weight of the elastomer is preferably in a range of 2000 to 200000, more preferably in a range of 10000 to 200000, and still more preferably in a range of 50000 to 100000. When the weight-average molecular weight thereof is in the above-described range, the solubility of the temporary adhesive in a solvent becomes excellent and the coating properties are improved.

Further, since the solubility in a solvent is excellent when the remaining temporary adhesive layer is removed after the base material is peeled off from the support, there is an advantage that residues do not remain on the base material or the support.

The elastomer of the present invention is not particularly limited, and examples thereof include a block copolymer, a random copolymer, and a graft copolymer. Among these, a block copolymer is preferable. Since a block copolymer is capable of suppressing the flow of the temporary adhesive during the heating process, adhesion can be maintained even during the heating process and an effect that peeling properties are not changed even during the heating process can be expected.

As the type of the elastomer, an elastomer having a repeating unit derived from styrene (polystyrene-based elastomer), a polyester-based elastomer, a polyolefin-based elastomer, a polyurethane-based elastomer, a polyamide-based elastomer, a polyacrylic elastomer, a silicone-based elastomer, and a polyimide-based elastomer. Among these, a polystyrene-based elastomer, a polyester-based elastomer, and a polyamide-based elastomer are particularly preferable and a polystyrene-based elastomer is most preferable from the viewpoint of the heat resistance and peeling properties.

In the present invention, it is preferable that the elastomer is a hydrogenated matter. A hydrogenated matter of a polystyrene-based elastomer is particularly preferable. In a case where the elastomer is a hydrogenated matter, the heat stability or storage stability is improved. Further, the peeling properties and the washing and removing properties of the temporary adhesive layer after being peeled off are improved. Further, the hydrogenated material indicates a polymer having a structure in which an elastomer is hydrogenated.

The 5% thermal mass reduction temperature of the elastomer when the temperature is raised at a rate of 20° C./min from 25° C. is preferably 250° C. or higher, more preferably 300° C. or higher, still more preferably 350° C. or higher, and even still more preferably 400° C. or higher. Further, the upper limit is not particularly limited, but is preferably 1000° C. or lower and more preferably 800° C. or lower. According to this embodiment, a temporary adhesive layer having excellent heat resistance is easily formed.

In a case where the original size of the elastomer used in the present invention is set to 100%, it is preferable that the elastomer can be deformed up to 200% by applying a small external force at room temperature (20° C.) and the elastomer has a property of returning to the original size by 130% or less in a short time when the external force is eliminated.

<<<<Polystyrene-Based Elastomer>>>>

The polystyrene-based elastomer is not particularly limited and can be selected as appropriate depending on the intended purpose. Examples thereof include a styrene-butadiene-styrene block copolymer (SBS), a styrene-isoprene-styrene block copolymer (SIS), a styrene-ethylene-butylene-styrene block copolymer (SEBS), a styrene-butadiene-butylene-styrene copolymer (SBBS), and hydrogenated materials of these, a styrene-ethylene-propylene-styrene block copolymer (SEPS), and a styrene-ethylene-ethylene-propylene-styrene block copolymer (SEEPS).

The content of the repeating unit derived from styrene in the polystyrene-based elastomer is preferably in a range of 10% to 90% by mass. From the viewpoint of peeling properties, the lower limit thereof is preferably 25% by mass or greater and more preferably 51% by mass or greater.

In the present invention, it is preferable that the polystyrene-based elastomer is used by combining an elastomer A containing repeating units derived from styrene at a proportion of 10% to 50% by mass of all repeating units and an elastomer B containing repeating units derived from styrene at a proportion of greater than 50% and 95% by mass or less of all repeating units. When a combination of the elastomer A and the elastomer B is used, the peeling properties become excellent, the flatness (hereinafter, also referred to as flat polishability) of the polished surface of the base material is improved, and occurrence of warpage of the base material after being polished can be effectively suppressed. The mechanism of obtaining such an effect can be assumed as follows.

In other words, since the elastomer A is formed of a relatively soft material, a temporary adhesive layer having elasticity is easily formed. Accordingly, when a laminate of a base material and a support is produced using the temporary adhesive composition of the present invention and the base material is polished to obtain a thin film, the temporary adhesive layer can be made to easily return to the original shape when elastically deformed even in a case where a pressure at the time of polishing is locally applied. As the result, excellent flat polishability can be obtained. Further, even in a case where the polished laminate is subjected to a heat treatment and then cooled, the internal stress generated at the time of cooling can be relaxed and the occurrence of warpage can be effectively suppressed by the temporary adhesive layer.

In addition, since the elastomer B is a relatively hard material, a temporary adhesive layer having excellent peeling properties can be produced when the temporary adhesive layer contains the elastomer B.

The content of the repeating units derived from styrene in the elastomer A is preferably in a range of 13% to 45% by mass and more preferably in a range of 15% to 40% by mass based on all repeating units. According to the embodiment, more excellent flat polishability can be obtained. Further, the occurrence of warpage of the polished base material can be effectively suppressed.

The hardness of the elastomer A is preferably in a range of 20 to 82 and more preferably in a range of 60 to 79. Further, the hardness is a value measured using a type A durometer according to a method in conformity with JIS K 6253.

The content of the repeating units derived from styrene in the elastomer B is preferably in a range of 55% to 90% by mass and more preferably in a range of 60% to 80% by mass based on all repeating units. According to the embodiment, the peeling properties can be more effectively improved.

The hardness of the elastomer B is preferably in a range of 83 to 100 and more preferably in a range of 90 to 99.

The ratio of the mass of the elastomer A to the mass of the elastomer B is preferably in a range of 5:95 to 95:5, more preferably in a range of 10:90 to 80:20, and still more preferably in a range of 15:85 to 60:40. When the ratio is in the above-described range, the above-described effects can be more effectively obtained.

As the polystyrene-based elastomer, a block copolymer of styrene and another resin is preferable, a block copolymer in which one terminal or both terminals are formed of a block copolymer of styrene is more preferable, and a block copolymer in which both terminals are formed of styrene is particularly preferable. In a case where the both ends of the polystyrene-based elastomer are formed of a block copolymer of styrene (block copolymer having a repeating unit derived from styrene), the heat stability tends to be more improved. This is because repeating units derived from styrene having excellent heat resistance are present at the terminals. Particularly, it is preferable that one terminal or both terminals are formed of a reactive polystyrene-based hard block having a repeating unit derived from styrene from the viewpoint that the heat resistance and the chemical resistance are more excellent. It is considered that phase separation between hard blocks and soft blocks is performed at a temperature of 200° C. or higher in a case where these are block copolymers. It is considered that the shape of the phase separation contributes to suppression of occurrence of unevenness on the substrate surface of the device wafer. In addition, such a resin is more preferable from the viewpoints of the solubility in a solvent and the resistance to a resist solvent.

Further, in a case where the polystyrene-based elastomer is a hydrogenated material, the stability with respect to heat is improved and deterioration such as decomposition or polymerization is unlikely to occur. Further, this is more preferable from the viewpoints of the solubility in a solvent and the resistance to a resist solvent.

From the viewpoint of the peeling properties after the heating step, the amount of an unsaturated double bond of the polystyrene-based elastomer is preferably less than 15 mmol, more preferably less than 5 mmol, and still more preferably less than 0.5 mmol per 1 g of the polystyrene-based elastomer. The amount of the unsaturated double bond here does not include an unsaturated double bond in a benzene ring derived from styrene. The amount of the unsaturated double bond can be calculated by nuclear magnetic resonance (NMR) measurement.

In addition, the "repeating unit derived from styrene" in the present specification is a constitutional unit derived from styrene contained in a polymer at the time of polymerizing styrene or a styrene derivative and may include a substituent. Examples of the styrene derivative include α-methylstyrene, 3-methylstyrene, 4-propylstyrene, and 4-cyclohexylstyrene. Examples of the substituent include an alkyl group having 1 to 5 carbon atoms, an alkoxy group having 1 to 5 carbon atoms, an alkoxyalkyl group having 1 to 5 carbon atoms, an acetoxy group, and a carboxyl group.

Examples of commercially available products of the polystyrene-based elastomer include TUFPRENE A, TUFPRENE 125, TUFPRENE 126S, SOLPRENE T, ASAPRENE T-411, ASAPRENE T-432, ASAPRENE T-437, ASAPRENE T-438, ASAPRENE T-439, TUFTEC H1272, TUFTEC P1500, TUFTEC H1052, TUFTEC H1062, TUFTEC M1943, TUFTEC M1911, TUFTEC H1041, TUFTEC MP10, TUFTEC M1913, TUFTEC H1051, TUFTEC H1053, TUFTEC P2000, and TUFTEC H1043 (all manufactured by Asahi Kasei Corporation), ELASTOMER AR-850C, ELASTOMER AR-815C, ELASTOMER AR-840C, ELASTOMER AR-830C, ELASTOMER AR-860C, ELASTOMER AR-875C, ELASTOMER AR-885C, ELASTOMER AR-SC-15, ELASTOMER AR-SC-0, ELASTOMER AR-SC-5, ELASTOMER AR-710, ELASTOMER AR-SC-65, ELASTOMER AR-SC-30, ELASTOMER AR-SC-75, ELASTOMER AR-SC-45, ELASTOMER AR-720, ELASTOMER AR-741, ELASTOMER AR-731, ELASTOMER AR-750, ELASTOMER AR-760, ELASTOMER AR-770, ELASTOMER AR-781, ELASTOMER AR-791, ELASTOMER AR-FL-75N, ELASTOMER AR-FL-85N, ELASTOMER AR-FL-60N, ELASTOMER AR-1050, ELASTOMER AR-1060, and ELASTOMER AR-1040 (all manufactured by ARONKASEI CO., LTD.), KRATON D1111, KRATON D1113, KRATON D1114, KRATON D1117, KRATON D1119, KRATON D1124, KRATON D1126, KRATON D1161, KRATON D1162, KRATON D1163, KRATON D1164, KRATON D1165, KRATON D1183, KRATON D1193, KRATON DX406, KRATON D4141, KRATON D4150, KRATON D4153, KRATON D4158, KRATON D4270, KRATON D4271, KRATON D4433, KRATON D1170, KRATON D1171, KRATON D1173, CARIFLEX IR0307, CARIFLEX IR0310, CARIFLEX IR0401, KRATON D0242, KRATON D1101, KRATON D1102, KRATON D1116, KRATON D1118, KRATON D1133, KRATON D1152, KRATON D1153, KRATON D1155, KRATON D1184, KRATON D1186, KRATON D1189, KRATON D1191, KRATON D1192, KRATON DX405, KRATON DX408, KRATON DX410, KRATON DX414, KRATON DX415, KRATON A1535, KRATON A1536, KRATON FG1901, KRATON FG1924, KRATON G1640, KRATON G1641, KRATON G1642, KRATON G1643, KRATON G1645, KRATON G1633, KRATON G1650, KRATON G1651, KRATON G1652, KRATON G1654, KRATON G1657, KRATON G1660, KRATON G1726, KRATON G1701, KRATON G1702, KRATON G1730, KRATON G1750, KRATON G1765, KRATON G4609, and KRATON G4610 (all manufactured by Kraton Corporation), TR2000, TR2001, TR2003, TR2250, TR2500, TR2601, TR2630, TR2787, TR2827, TR1086, TR1600, SIS5002, SIS5200, SIS5250, SIS5405, SIS5505, DYNARON 6100P, DYNARON 4600P, DYNARON 6200P, DYNARON 4630P, DYNARON 8601P, DYNARON 8630P, DYNARON 8600P, DYNARON 8903P, DYNARON 6201B, DYNARON 1321P, DYNARON 1320P, DYNARON 2324P, and DYNARON 9901P (all manufactured by JSR CORPORATION), denka STR series (manufactured by Denka Seiken Co., Ltd.), QUINTAC 3520, QUINTAC 3433N, QUINTAC 3421, QUINTAC 3620, QUINTAC 3450, and QUINTAC 3460 (all manufactured by ZEON CORPORATION), TPE-SB series (manufactured by Dainippon Sumitomo Phama Co., Ltd.), RABALON series (manufactured by Mitsubishi Chemical Corporation), SEPTON 1001, SEPTON 8004, SEPTON 4033, SEPTON 2104, SEPTON 8007, SEPTON 2007, SEPTON 2004, SEPTON 2063, SEPTON HG252, SEPTON 8076, SEPTON 2002, SEPTON 1020, SEPTON 8104, SEPTON 2005, SEPTON 2006, SEPTON 4055, SEPTON 4044, SEPTON 4077, SEPTON 4099, SEPTON 8006, SEPTON V9461, SEPTON V9475, SEPTON V9827, HYBRAR 7311, HYBRAR 7125, HYBRAR 5127, and HYBRAR 5125 (all manufactured by Kuraray Co., Ltd.), SUMIFLEX (manufactured by Sumitomo Bakelite Company Limited), LEOSTOMER, and ACTYMER (both manufactured by RIKEN TECHNOS CORP.).

<<<<Polyester-Based Elastomer>>>>

The polyester-based elastomer is not particularly limited and can be selected as appropriate depending on the intended purpose thereof. For example, elastomers obtained by polycondensing dicarboxylic acid or a derivative thereof and a diol compound or a derivative thereof may be exemplified.

Examples of the dicarboxylic acid include aromatic dicarboxylic acid such as terephthalic acid, isophthalic acid, or naphthalene dicarboxylic acid; aromatic dicarboxylic acid in which these aromatic hydrogen atoms are substituted with a methyl group, an ethyl group, a phenyl group, and the like; aliphatic dicarboxylic acid having 2 to 20 carbon atoms such as adipic acid, sebacic acid, or dodecanedicarboxylic acid; and alicyclic dicarboxylic acid such as cyclohexanedicarboxylic acid. These may be used alone or in combination of two or more kinds thereof.

Examples of the diol compound include an aliphatic diol such as ethylene glycol, 1,3-propanediol, 1,4-butanediol, 1,6-hexanediol, 1,10-decanediol, or 1,4-cyclohexanediol, an alicyclic diol, and divalent phenol represented by the following structural formula.

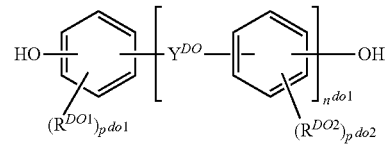

In the formula, $Y^{DO}$ represents any of an alkylene group having 1 to 10 carbon atoms, a cycloalkylene group having 4 to 8 carbon atoms, $-O-$, $-S-$, and $-SO_2-$ or a direct bond (single bond) between benzene rings. $R^{DO1}$ and $R^{DO2}$ each independently represent a halogen atom or an alkyl group having 1 to 12 carbon atoms. $p^{do1}$ and $p^{do2}$ each independently represent an integer of 0 to 4 and $n^{do1}$ represents 0 or 1.

Specific examples of the polyester-based elastomer include bisphenol A, bis(4-hydroxyphenyl)methane, bis(4-hydroxy-3-methylphenyl)propane, and resorcin. There may be used alone or in combination of two or more kinds thereof.

Further, as the polyester-based elastomer, a multi-block copolymer obtained by forming an aromatic polyester portion (for example, polybutylene terephthalate) with a hard segment component and forming an aliphatic polyester portion (for example, polytetramethylene glycol) with a soft segment component can be used. Examples of the multi-block copolymer include those with various grades depending on the difference between the types, the proportions, and the molecular weights of the hard segment or the soft segment. Specific examples thereof include HYTREL (manufactured by DU PONT-TORAY CO., LTD.), PELPRENE (manufactured by TOYOBO CO., LTD.), PRIMALLOY (manufactured by Mitsubishi Chemical Corporation), NUBERAN (manufactured by TEIJIN LIMITED), and ESPEL 1612 and ESPEL 1620 (both manufactured by Hitachi Chemical Co., Ltd.).

<<<<Polyolefin-Based Elastomer>>>>

The polyolefin-based elastomer is not particularly limited and can be selected as appropriate depending on the intended purpose thereof. Examples thereof include a copolymer of α-olefin having 2 to 20 carbon atoms such as ethylene, propylene, 1-butene, 1-hexene, or 4-methyl-1-pentene. Examples of the copolymer include an ethylene-propylene copolymer (EPR), and an ethylene-propylene-diene copolymer (EPDM). Further, other examples thereof include a copolymer of non-conjugated diene and α-olefin having 2 to 20 carbon atoms such as dicyclopentadiene, 1,4-hexandiene, cyclooctadiene, methylene norbornene, or ethylidene norbornene. Further, a carboxy-modified nitrile rubber obtained by copolymerizing methacrylic acid with a butadiene-acrylonitrile copolymer may be exemplified. Other examples thereof include an ethylene-α-olefin copolymer rubber, an ethylene-α-olefin-non-conjugated diene copolymer rubber, a propylene-α-olefin copolymer rubber, and a butene-α-olefin copolymer rubber.

Examples of commercially available products thereof include MILASTOMER (manufactured by Mitsui Chemicals, Inc.), THERMORUN (manufactured by Mitsubishi Chemical Corporation), EXACT (manufactured by Exxon Chemical Company, Inc.), ENGAGE (manufactured by The Dow Chemical Company), ESPOLEX (manufactured by SUMITOMO CHEMICAL Co., Ltd.), Sarlink (manufactured by TOYOBO CO., LTD.), NEWCON (manufactured by Japan Polypropylene Corporation), and EXCELINK (manufactured by JSR Corporation).

<<<<Polyurethane-Based Elastomer>>>>

The polyurethane-based elastomer is not particularly limited and can be selected as appropriate depending on the intended purpose thereof. Examples thereof include elastomers which include a constitutional unit having a hard segment formed of low-molecular weight glycol and diisocyanate and a soft segment formed of a high-molecular weight (long chain) diol and diisocyanate.

Examples of the high-molecular weight (long chain) diol include polypropylene glycol, polytetramethylene oxide, poly(1,4-butyleneadipate), poly(ethylene-1,4-butyleneadipate), polycaprolactone, poly(1,6-hexylenecarbonate), and poly(1,6-hexylene-neopentyleneadipate). The number average molecular weight of the high-molecular weight (long chain) diol is preferably in a range of 500 to 10000.

As the low-molecular weight glycol, short chain diols such as ethylene glycol, propylene glycol, 1,4-butanediol, and bisphenol A can be used. The number average molecular weight of the short diol is preferably in a range of 48 to 500.

Examples of commercially available products of the polyurethane-based elastomer include PANDEX T-2185 and PANDEX T-2983N (both manufactured by DIC Corporation), MIRACTRAN (manufactured by Nippon Miractran Co., Ltd.), ELASTOLLAN (manufactured by BASF Japan Ltd.), RESAMINE (manufactured by Dainichiseika Color & Chemicals Mfg. Co., Ltd.), PELLETHANE (manufactured by The Dow Chemical Company), IRONRUBBER (manufactured by NOK CORPORATION), and MOBILON (manufactured by Nisshinbo Chemical Inc.).

<<<<Polyamide-Based Elastomer>>>>

The polyamide-based elastomer is not particularly limited and can be selected as appropriate depending on the intended purpose thereof. Examples thereof include an elastomer obtained by using a polyamide such as polyamide-6, polyamide-11, or polyamide-12 for a hard segment and an elastomer obtained by using polyether and/or polyester such as polyoxyethylene, polyoxypropylene, or polytetramethylene glycol for a soft segment. These elastomers are largely divided into two types of a polyether block amide type and a polyether ester block amide type.

Examples of commercially available products thereof include UBE polyamide elastomer and UBESTA XPA (both manufactured by Ube Industries, Ltd.), DAIAMIDE (manufactured by Daicel-Evonik Ltd.), PEBAX (manufactured by ARKEMA Inc.), GRILON ELX (manufactured by EMS-CHEMIE Japan Ltd.), NOVAMID (manufactured by Mitsui Chemicals, Inc.), GRELAX (manufactured by TOYOBO CO., LTD.), polyether ester amide PA-200, PA-201, TPAE-12, TPAE-32, polyester amide TPAE-617, and TPAE-617C (all manufactured by T & K TOKA CO., LTD.).

<<<<Polyacrylic Elastomer>>>>

The polyacrylic elastomer is not particularly limited and can be selected as appropriate depending on the purpose thereof. Examples thereof include an elastomer having acrylic acid ester such as ethyl acrylate, butyl acrylate, methoxyethyl acrylate, or ethoxyethyl acrylate as a main component; and a copolymer of acrylic acid ester, glycidyl methacrylate, and allyl glycidyl ether. Further, other examples thereof include a copolymer obtained by copolymerizing acrylic acid ester and a cross-linking monomer such as acrylonitrile or ethylene. Specific examples thereof include an acrylonitrile-butyl acrylate copolymer, an acrylonitrile-butyl acrylate-ethyl acrylate copolymer, and an acrylonitrile-butyl acrylate-glycidyl methacrylate copolymer.

<<<<Silicone-Based Elastomer>>>>

The silicone-based elastomer is not particularly limited and can be selected as appropriate depending on the purpose thereof. Examples thereof include elastomers having organopolysiloxane as a main component, such as a polydimethylsiloxane-based elastomer, a polymethylphenylsiloxane-based elastomer, and a polydiphenylsiloxane-based elastomer. Specific examples of commercially available products thereof include KE series Shin-Etsu Chemical Co., Ltd.), SE series, CY series, and SH series (all manufactured by Dow Corning Toray Co., Ltd.).

<<<<Other Elastomers>>>>

As other elastomers of the present invention, a rubber-modified epoxy resin (epoxy-based elastomer) can be used. The epoxy-based elastomer is obtained by modifying a part of or all epoxy groups of a bisphenol F type epoxy resin, a bisphenol A type epoxy resin, a salicylaldehyde type epoxy resin, a phenol novolak type epoxy resin, or a cresol novolak type epoxy resin with a both-terminal carboxylic acid-modified butadiene-acrylonitrile rubber, a terminal amino-modified silicone rubber, or the like.

<<Other Polymer Compounds>>

In the present invention, polymer compounds other than the above-described elastomers (also referred to as other polymer compounds) can be used as the binder. Other polymer compounds can be used alone or in combination of two or more kinds thereof.

Specific examples of other polymer compounds include a hydrocarbon resin, a novolak resin, a phenol resin, an epoxy resin, a melamine resin, a urea resin, an unsaturated polyester resin, an alkyd resin, a polyamide resin, a polyimide resin, a polyamide imide resin, a polybenzimidazole resin, a polybenzoxazole resin, a polyvinyl chloride resin, a polyvinyl acetate resin, a polyacetal resin, a polycarbonate resin, a polyphenylene ether resin, a polybutylene terephthalate resin, a polyacetal resin, a polyethylene terephthalate resin, a polyphenylene sulfide resin, a polysulfone resin, a polyethersulfone resin, a polyarylate resin, a polyether ether ketone resin, and a methyl methacrylate-styrene copolymer resin (Estyrene MS-200 as an example of a commercially available product (manufactured by NIPPON STEEL & SUMIKIN CHEMICAL CO., LTD.)). Among these, a hydrocarbon resin, a polyether sulfone resin, a polyimide resin, and a polycarbonate resin are preferable and a polyether sulfone resin and a hydrocarbon resin are more preferable.

In the present invention, a binder containing fluorine atoms described below can be used as a binder, but it is preferable that the temporary adhesive layer does not substantially contain the binder containing fluorine atoms (hereinafter, also referred to as a fluorine-based binder). The expression "the temporary adhesive layer does not substantially contain the fluorine-based binder" indicates that the content of the fluorine-based binder is preferably 0.1% by mass or less, more preferably 0.05% by mass or less, and still more preferably 0% by mass with respect to the total mass of the binder.

<<<Hydrocarbon Resin>>>

In the present invention, arbitrary resins can be used as the hydrocarbon resin.

The hydrocarbon resin indicates a resin basically formed of only carbon atoms and hydrogen atoms, but other atoms may be included in the side chain thereof as long as the basic skeleton is a hydrocarbon resin. In other words, the concept of the hydrocarbon resin of the present invention includes a case where functional groups other than a hydrocarbon group are directly bonded to the main chain of the hydrocarbon resin formed of only carbon atoms and hydrogen atoms such as an acrylic resin, a polyvinyl alcohol resin, a polyvinyl acetal resin, or a polyvinyl pyrrolidone resin. In this case, the content of a repeating unit formed by a hydrocarbon group being directly bonded to the main chain thereof is preferably 30% by mole or greater with respect to the all repeating units of the resin.

Examples of the hydrocarbon resin that satisfies the above-described conditions include a terpene resin, a terpene phenol resin, a modified terpene resin, a hydrogenated terpene resin, a hydrogenated terpene phenol resin, rosin, rosin ester, hydrogenated rosin, hydrogenated rosin ester, polymerized rosin, polymerized rosin ester, modified rosin, a rosin-modified phenol resin, an alkylphenol resin, an aliphatic petroleum resin, an aromatic petroleum resin, a hydrogenated petroleum resin, a modified petroleum resin, an alicyclic petroleum resin, a coumarone petroleum resin, an indene petroleum resin, a polystyrene-polyolefin copolymer, an olefin polymer (such as a methylpentene copolymer), and a cycloolefin polymer (such as a norbornene-based copolymer, a dicyclopentadiene copolymer, or a tetracyclododecene copolymer).

Among these, as the hydrocarbon resin, a terpene resin, rosin, a petroleum resin, hydrogenated rosin, polymerized rosin, an olefin polymer, or a cycloolefin polymer is preferable, a terpene resin, rosin, an olefin polymer, or a cycloolefin polymer is more preferable, and a cycloolefin polymer is still more preferable.

Examples of the cycloolefin polymer include a norbornene-based copolymer, a polymer of a monocyclic olefin, a polymer of a cyclic conjugated diene, a vinyl alicyclic hydrocarbon polymer, and hydrides of these polymers. Preferred examples of the cycloolefin polymer include an addition (co)polymer having at least one repeating unit represented by Formula (II) and an addition (co)polymer formed by further having at least one repeating unit represented by Formula (I). In addition, other preferred examples of the cycloolefin polymer include a ring-opened (co)polymer having at least one cyclic repeating unit represented by Formula (III).

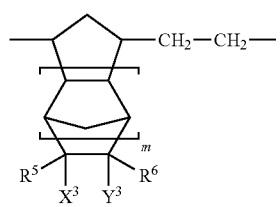

(III)

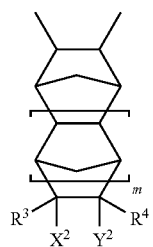

(II)

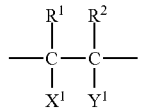

(I)

In the formulae, m represents an integer of 0 to 4. $R^1$ to $R^6$ each represent a hydrogen atom or a hydrocarbon group having 1 to 10 carbon atoms, $X^1$ to $X^3$ and $Y^1$ to $Y^3$ each represent a hydrogen atom, a hydrocarbon group having 1 to 10 carbon atoms, a halogen atom, a hydrocarbon group having 1 to 10 carbon atoms which is substituted with a halogen atom, $-(CH_2)_nCOOR^{11}$, $-(CH_2)_nOCOR^{12}$, $-(CH_2)_nNCO$, $-(CH_2)_nNO_2$, $-(CH_2)_nCN$, $-(CH_2)_nCONR^{13}R^{14}$, $-(CH_2)_nNR^{15}R^{16}$, $-(CH_2)_nOZ$, $-(CH_2)_nW$, or $(-CO)_2O$ or $(-CO)_2NR^{17}$ configured of $X^1$ and $Y^1$, $X^2$ and $Y^2$, or $X^3$ and $Y^3$. $R^{11}$, $R^{12}$, $R^{13}$, $R^{14}$, $R^{15}$, $R^{16}$, and $R^{17}$ each represent a hydrogen atom or a hydrocarbon group (preferably a hydrocarbon group having 1 to 20 carbon atoms), Z represents a hydrocarbon group or a hydrocarbon group substituted with halogen, and W represents $SiR^{18}_pD_{3-p}$ ($R^{18}$ represents a hydrocarbon group having 1 to 10 carbon atoms, D represents a halogen atom, $-OCOR^{18}$, or $-OR^{18}$, and p represents an integer of 0 to 3). n represents an integer of 0 to 10.

The norbornene-based polymer is disclosed in JP1998-7732A (JP-H10-7732A), JP2002-504184A, US2004/229157A1, and WO2004/070463A1. The norbornene-based polymer can be obtained by performing addition polymerization on norbornene-based polycyclic unsaturated compounds. Further, as necessary, a norbornene-based polycyclic unsaturated compound, ethylene, propylene, or butene; a conjugated diene such as butadiene or isoprene; and a non-conjugated diene such as ethylidene norbornene can be subjected to addition polymerization. Such a norbornene-based polymer is commercially available under the product name of APEL (manufactured by Mitsui Chemicals, Inc.) and these products have various grades, for example, APL8008T (Tg of 70° C.), APL6013T (Tg of 125° C.), or APL6015T (Tg of 145° C.) with different glass transition temperatures (Tg). Further, Pellets such as TOPAS 8007, TOPAS 5013, TOPAS 6013, and TOPAS 6015 (manufactured by Polyplastics Co., Ltd.) are commercially available. As another example, Appear 3000 (manufactured by FILM Ferrania s.r.l) is commercially available.

As disclosed in JP1989-240517A (JP-H01-240517A), JP1995-196736A (JP-H07-196736A), JP1985-26024A (JP-S60-26024A), JP1987-19801A (JP-S62-19801A), JP2003-1159767A, and JP2004-309979A, a hydride of the norbornene-based polymer can be produced by performing addition polymerization or metathesis ring opening polymerization on a polycyclic unsaturated compound and then hydrogenating the resultant.

In Formula (III), it is preferable that $R^5$ and $R^6$ represent a hydrogen atom or a methyl group and $X^3$ and $Y^3$ represent a hydrogen atom. Other groups are selected as appropriate. The norbornene-based polymer is commercially available under the product names of Arton G and Arton F (manufactured by JSR Corporation); and Zeonor ZF14, Zeonor ZF16, Zeonex 250, Zeonex 280, and Zeonex 480R (manufactured by Zeon Corporation), and these can be used.

<<<Polyimide Resin>>>

As the polyimide resin, a tetracarboxylic dianhydride and a diamine can be subjected to a condensation reaction according to a known method and then used.

Examples of the known synthesis method include a method of performing dehydration ring closure on polyamic acid obtained by mixing the approximately equi-molar amounts of tetracarboxylic dianhydride and diamine in an organic solvent, and reacting the mixture at a reaction temperature of 80° C. or lower. Here, the equi-molar amounts of tetracarboxylic dianhydride and diamine mean that the ratio between the molar amount of the tetracarboxylic dianhydride and the molar amount of the diamine is around 1:1. Further, as necessary, the compositional ratio between the tetracarboxylic dianhydride and the diamine may be adjusted such that the total amount of diamine to the total amount of 1.0 mol of tetracarboxylic dianhydride is in a range of 0.5 to 2.0 mol. When the compositional ratio between the tetracarboxylic dianhydride and the diamine is adjusted to be in the above-described range, the weight-average molecular weight of the polyimide resin can be adjusted.

The tetracarboxylic anhydride is not particularly limited, and examples thereof include pyromellitic dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl) propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenyl)ether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 2,3,3'4'-benzophenonetetracarboxylic dianhydride, 1,2,5,6-naphthalenetetracarboxylic dianhydride, 1,4,5,8-naphthalenetetracarboxylic dianhydride, 2,3,6,7-naphthalenetetracarboxylic dianhydride, 1,2,4,5-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,4,5-tetracarboxylic dianhydride, 2,3,3'4'-biphenyltetracarboxylic dianhydride, 3,4,3',4'-biphenyltetracarboxylic dianhydride, 2,3,2',3'-biphenyltetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylenebis(trimellitate anhydride), ethylene tetracarboxylic dianhydride, 1,2,3,4-butanetetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis(exo-bicyclo[2,2,1]heptane-2,3-dicarboxylic dianhydride, bicyclo-[2,2,2]-oct-7-ene-2,3,5,6-tetracarboxylic acid)dianhydride, 2,2-bis(3,4-dicarboxyphenyl)propane dianhydride, 2,2-bis[4-(3,4-dicarboxyphenyl)phenyl]propane dianhydride, 2,2-bis(3,4-dicarboxyphenyl)hexafluoropropane dianhydride, 2,2-bis[4-(3,4-dicarboxyphenyl)phenyl]hexafluoropropane dianhydride, 4,4'-bis(3,4-dicarboxyphenoxy)diphenylsulfide dianhydride, 1,4-bis(2-hydroxyhexafluoroisopropyl)benzenebis(trimellitate dianhydride), 1,3-bis(2-hydroxyhexafluoroisopropyl)benzenebis(trimellitate dianhydride), 5-(2,5-dioxotetrahydrofuryl)-3-methyl-3-cyclohexene-1,2-dicarboxylic dianhydride, tetrahydrofuran-2,3,4,5-tetracarboxylic dianhydride, 4,4'-oxydiphthalic dianhydride, 1,2-(ethylene)bis(trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride), and 1,18-(octadecamethylene)bis(trimellitate anhydride). These may be used alone or in combination of two or more kinds thereof. Among these, 3,4,3',4'-benzophenonetetracarboxylic dianhydride, 2,3,2',3'-benzophenonetetracarboxylic dianhydride, and 2,3,3',4'-benzophenonetetracarboxylic dianhydride are preferable and 3,4,3',4'-benzophenonetetracarboxylic dianhydride is more preferable.

The diamine is not particularly limited and examples thereof include aromatic diamines such as o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, bis(4-amino-3,5-dimethylphenyl) methane, bis(4-amino-3,5-diisopropylphenyl)methane, 3,3'-diaminodiphenyldifluoromethane, 3,4'-diaminodiphenyldifluoromethane, 4,4'-diaminodiphenyldifluoromethane, 3,3'-diaminodiphenylsulfone, 3,4'-diaminodiphenyl sulfone, 4,4'-diaminodiphenyl sulfone, 3,3'-diaminodiphenyl sulfide, 3,4'-diaminodiphenyl sulfide, 4,4'-diaminodiphenyl sulfide, 3,3'-diaminodiphenyl ketone, 3,4'-diaminodiphenyl ketone, 4,4'-diaminodiphenyl ketone, 3-(4-aminophenyl)-1,1,3-trimethyl-5-aminoindan, 2,2-bis(3-aminophenyl)propane, 2,2'-(3,4'-diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy)benzene, 1,4-bis(3-aminophenoxy)benzene, 1,4-bis(4-aminophenoxy)benzene, 3,3'-(1,4-phenylenebis(1-methylethylidene))bisaniline, 3,4'-(1,4-phenylenebis(1-methylethylidene))bisaniline, 4,4'-(1,4-phenylenebis(1-methylethylidene))bisaniline, 2,2-bis(4-(3-aminophenoxy) phenyl)propane, 2,2-bis(4-(3-aminophenoxy)phenyl) hexafluoropropane, 2,2-bis(4-(4-aminophenoxy)phenyl) hexafluoropropane, bis(4-(3-aminophenoxy)phenyl)sulfide, bis(4-(4-aminophenoxy)phenyl) sulfide, bis(4-(3-aminophenoxy)phenyl)sulfone, bis(4-(4-aminophenoxy)phenyl)sulfone, 3,3'-dihydroxy-4,4'-diaminobiphenyl, and 3,5-diaminobenzoic acid, 1,3-bis(aminomethyl)cyclohexane, 2,2-bis(4-aminophenoxyphenyl)propane, polyoxypropylenediamine, 4,9-dioxadodecane-1,12-diamine, 4,9,14-trioxaheptadecane-1,17-diamine, 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-diaminocyclohexane, and 1,3-bis(3-aminopropyl) tetramethyldisiloxane.

Among these, at least one selected from the group consisting of 3-(4-aminophenyl)-1,1,3-trimethyl-5-aminoindan, 1,3-bis(3-aminopropyl)tetramethyldisiloxane, polyoxypropylenediamine, 2,2-bis(4-aminophenoxyphenyl)propane, 4,9-dioxadecane-1,12-diamine, 1,6-diaminohexane, and 4,9,14-trioxaheptadecane-1,17-diamine is preferable and 3-(4-aminophenyl)-1,1,3-trimethyl-5-aminoindane is more preferable.

Examples of the solvent used to react the tetracarboxylic dianhydride and the diamine include N,N-dimethylacetamide, N-methyl-2-pyrrolidone, and N,N-dimethylformamide. In order to adjust the solubility of raw materials or the like, a non-polar solvent (for example, toluene or xylene) may be used together.

The reaction temperature of the tetracarboxylic dianhydride and the diamine is preferably lower than 100° C. and more preferably lower than 90° C. Further, imidization of polyamic acid is typically carried out by performing a heat treatment in an inert atmosphere (typically, in a vacuum or in a nitrogen atmosphere). The temperature of the heat treatment is preferably 150° C. or higher and more preferably in a range of 180° C. to 450° C.

The weight-average molecular weight (Mw) of the polyimide resin is preferably in a range of 10000 to 1000000 and more preferably in a range of 20000 to 100000.

In the present invention, as the polyimide resin, a polyimide resin whose solubility in at least one solvent selected from γ-butyrolactone, cyclopentanone, N-methylpyrrolidone, N-ethyl-2-pyrrolidone, cyclohexanone, glycol ether, dimethyl sulfoxide, and tetramethylurea at 25° C. is 10 g/100 g solvent or greater is preferable.

As the polyimide resin having such a solubility, a polyimide resin obtained by reacting 3,4,3',4'-benzophenonetetracarboxylic dianhydride and 3-(4-aminophenyl)-1,1,3-trimethyl-5-aminoindan may be exemplified. This polyimide resin has particularly excellent heat resistance.

As the polyimide resin, commercially available products may be used. For example, Durimide (registered trademark) 200, Durimide 208A, and Durimide 284 (all manufactured by Fujifilm Corporation), GPT-LT (manufactured by Gun Ei Chemical Industry Co., Ltd.), and SOXR-S, SOXR-M, SOXR-U, and SOXR-C (manufactured by Nippon Kodoshi Corporation).

<<<Polycarbonate Resin>>>

In the present invention, it is preferable that the polycarbonate resin has a repeating unit represented by Formula (1).

(1)

In Formula (1), $Ar^1$ and $Ar^2$ each independently represent an aromatic group and L represents a single bond or a divalent linking group.

$Ar^1$ and $Ar^2$ in Formula (1) each independently represent an aromatic group. Examples of the aromatic group include a benzene ring, a naphthalene ring, a pentalene ring, an indene ring, an azulene ring, a heptalene ring, an indecene ring, a perylene ring, a pentacene ring, an acenaphthylene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxaline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring is preferable.

These aromatic groups may include a substituent, but it is preferable that these aromatic groups do not include a substituent.

Examples of the substituent which an aromatic group may have include a halogen atom, an alkyl group, an alkoxy group, and an aryl group.

Examples of the halogen atom include a fluorine atom, a chlorine atom, a bromine atom, and an iodine atom.

As the alkyl group, an alkyl group having 1 to 30 carbon atoms may be exemplified. The number of carbon atoms of the alkyl group is more preferably in a range of 1 to 20 and still more preferably in a range of 1 to 10. The alkyl group may be linear or branched. Further, a part or all hydrogen atoms of the alkyl group may be substituted with halogen atoms. Examples of the halogen atoms include a fluorine atom, a chlorine atom, a bromine atom, and an iodine atom. Among these, a fluorine atom is preferable.

As the alkoxy group, an alkoxy group having 1 to 30 carbon atoms is preferable. The number of carbon atoms of the alkoxy group is more preferably in a range of 1 to 20 and still more preferably in a range of 1 to 10. The alkoxy group may be linear, branched, or cyclic.

As the aryl group, an aryl group having 6 to 30 carbon atoms is preferable and an aryl group having 6 to 20 carbon atoms is more preferable.

The weight-average molecular weight (Mw) of the polycarbonate resin is preferably in a range of 1000 to 1000000 and more preferably in a range of 10000 to 80000. When the weight-average molecular weight thereof is in the above-described range, the solubility in a solvent and the heat resistance are excellent.

Examples of commercially available products of the polycarbonate resin include PCZ-200, PCZ-300, PCZ-500, and PCZ-800 (all manufactured by Mitsubishi Gas Chemical Company, Inc.), APEC9379 (manufactured by BAYER AG), and Panlite L-1225LM (manufactured by TEIJIN LIMITED).

<<<Polyether Sulfone Resin>>>

Examples of commercially available products of the polyether sulfone resin include Ultrason E2020P, Ultrason E6020P (both manufactured by BASF Japan Ltd.), and SUMIKAEXCEL 3600P, SUMIKAEXCEL 4100P, SUMIKAEXCEL 4800P, SUMIKAEXCEL 5003P, SUMIKAEXCEL5003PS, SUMIKAEXCEL 5200P, SUMIKAEXCEL5400P, and SUMIKAEXCEL5900P (all manufactured by SUMITOMO CHEMICAL Co., Ltd.).

The content of the temporary adhesive (preferably the elastomer) in the temporary adhesive composition of the present invention is preferably in a range of 50.00% to 99.99% by mass, more preferably in a range of 70.00% to 99.99% by mass, and still more preferably in a range of 88.00% to 99.99% by mass with respect to the total solid content from which the content of solvents is removed. The temporary adhesive composition may contain one or two or more kinds of temporary adhesives.

<<<Antioxidant>>>

The temporary adhesive composition of the present invention may contain an antioxidant from the viewpoint of preventing a decrease in molecular weight of the elastomer or gelation due to oxidation during the heating. As the antioxidant, a phenol-based antioxidant, a sulfur-based antioxidant, a phosphorus-based antioxidant, a quinone-based antioxidant, and an amine-based antioxidant can be used.

As specific examples of the antioxidant, the description in paragraphs 0048 and 0049 of JP2014-212292A can be referred to and these contents are incorporated in the present specification.

In a case where the temporary adhesive composition contains an antioxidant, the content of the antioxidant is preferably in a range of 0.001% to 20.0% by mass and more preferably in a range of 0.005% to 10.0% by mass with respect to the total solid content of the temporary adhesive composition.

The antioxidant may be used alone or in combination of two or more kinds thereof. In a case where two or more kinds of antioxidants are used, it is preferable that the total content thereof is in the above-described range.

<<<Surfactant>>>

Various surfactants may be added to the temporary adhesive composition of the present invention from the viewpoint of further improving the coating properties. As the surfactants, various surfactants such as a fluorine-based surfactant, a non-ionic surfactant, a cationic surfactant, an anionic surfactant, and a silicone-based surfactant can be used.

Particularly, since the liquid properties (particularly, fluidity) of a prepared coating solution are further improved when the temporary adhesive composition of the present invention contains a fluorine-based surfactant, the uniformity in coating thickness or liquid-saving properties can be further improved.

In other words, in a case where a film is formed using a coating solution to which the temporary adhesive containing a fluorine-based surfactant is applied, the wettability with respect to the surface to be coated is improved and the coating properties with respect to the surface to be coated are improved by decreasing the interfacial tension between the surface to be coated and the coating solution. Therefore, it is effective that the temporary adhesive composition contains a fluorine-based surfactant in terms that a film which has less thickness unevenness and has a uniform film thickness can be more preferably formed even in a case where a thin film having a thickness of several micrometers is formed using a small amount of coating solution.

The content of fluorine in the fluorine-based surfactant is preferably in a range of 3% to 40% by mass, more preferably in a range of 5% to 30% by mass, and still more preferably in a range of 7% to 25% by mass. The fluorine-based surfactant in which the content of fluorine is in the above-described range is effective in terms of uniformity in thickness of a coated film or liquid-saving properties and the solubility in the temporary adhesive is also excellent.

Examples of the fluorine-based surfactant include MEGAFACE F-171, MEGAFACE F-172, MEGAFACE F-173, MEGAFACE F-176, MEGAFACE F-177, MEGAFACE F-141, MEGAFACE F-142, MEGAFACE F-143, MEGAFACE F-144, MEGAFACE F-251, MEGAFACE F-281, MEGAFACE F-430, MEGAFACE F-437, MEGAFACE F-444, MEGAFACE F-475, MEGAFACE F-477, MEGAFACE F-479, MEGAFACE F-482, MEGAFACE F-510, MEGAFACE F-552, MEGAFACE F-553, MEGAFACE F-554, MEGAFACE F-555, MEGAFACE F-556, MEGAFACE F-557, MEGAFACE F-558, MEGAFACE F-559, MEGAFACE F-560, MEGAFACE F-561, MEGAFACE F-562, MEGAFACE F-563, MEGAFACE F-562, MEGAFACE F-563, MEGAFACE F-565, MEGAFACE F556, MEGAFACE F-557, MEGAFACE F-558, MEGAFACE F-559, MEGAFACE F-560, MEGAFACE F-561, MEGAFACE-562, MEGAFACE F-563, MEGAFACE F-565, MEGAFACE F-567, MEGAFACE F-568, MEGAFACE F-569, MEGAFACE F-570, MEGAFACE F-571, MEGAFACE F-780, MEGAFACE F-781, MEGAFACE R-30, MEGAFACE R-40, MEGAFACE R-41, MEGAFACE R-43, MEGAFACE R-94 (all manufactured by DIC Corporation), FC-430, FC-431, FC-171, FC-4430, FC-4432 (all manufactured by Sumitomo 3M Limited), SURFLON SC-101, SURFLON SC-103, SURFLON SC-104, SURFLON SC-105, SURFLON S-242, SURFLON S-243, SURFLON SC-381, SURFLON S-382, SURFLON SC-383, SURFLON S-386, SURFLON S-393, SURFLON S-651, SURFLON S-611, SURFLON S-420, SURFLON SC-1068, SURFLON KH-40 (all manufactured by AGC SEIMI CHEMICAL CO., LTD.), PF-636, PF-656, PF-6320, PF-6520, and PF-7002 (all manufactured by OMNOVA Solutions Inc.).

Specific examples of the non-ionic surfactant include glycerol, trimethylolpropane, trimethylolethane and ethoxylate and propoxylate of these (such as glycerol propoxylate or glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid ester (PLURONIC L10, PLURONIC L31, PLURONIC L61, PLURONIC L62, PLURONIC 10R5, PLURONIC 17R2, PLURONIC 25R2 (all manufactured by BASF Japan Ltd.), TETRONIC 304, TETRONIC 701, TETRONIC 704, TETRONIC 901, TETRONIC 904, TETRONIC 150R1, and SOLSPERSE 20000 (manufactured by Lubrizol Corporation).

Specific examples of the cationic surfactant include a phthalocyanine derivative (trade name: EFKA-745, manufactured by Morishita Co., Ltd.), an organosiloxane polymer KP341 (manufactured by Shin-Etsu Chemical Co., Ltd.), a (meth)acrylic acid (co)polymer POLYFLOW No. 75, POLYFLOW No. 90, POLYFLOW No. 95 (manufactured by KYOEISHA CHEMICAL Co., Ltd.), and W001 (manufactured by Yusho Co., Ltd.).

Specific examples of the anionic surfactant include W004, W005, and W017 (manufactured by Yusho Co., Ltd.).

Examples of the silicone-based surfactant include TSF-4440, TSF-4300, TSF-4445, TSF-4460, TSF-4452 (all manufactured by Momentive Performance Materials Inc.), KP-341, KF-6001, KF-6002 (all manufactured by Shin-Etsu Chemical Co., Ltd.), BYK-307, BYK-323, and BYK-330 (all manufactured by BYK Japan K.K.).

The surfactant may be used alone or in combination of two or more kinds thereof. The amount of the surfactant to be added is preferably in a range of 0.001% to 2.0% by mass and more preferably in a range of 0.005% to 1.0% by mass with respect to the total solid content of the temporary adhesive.

<<<Other Components>>>

As necessary, various additives such as a curing agent, a curing catalyst, a radical polymerizable compound, a radical polymerization initiator, a fluorine-based compound, a leveling agent, an anti-foaming agent, a silane coupling agent, a filler, an adhesion promotor, an ultraviolet absorbing agent, and an aggregation inhibitor can be blended into the temporary adhesive composition of the present invention as long as the effects of the present invention are not impaired. In a case where these additives are blended into the temporary adhesive composition, the total amount of the additives to be blended is preferably 3% by mass or less of the total solid content of the temporary adhesive composition. As the details of these additives, the description in paragraphs 0065 to 0094 and the description in paragraphs 0096 to 0120 of JP2014-212292 can be referred to and the contents of these are incorporated in the present specification.

EXAMPLES

Hereinafter, the present invention will be described in more detail with reference to the examples described below, but the present invention is not limited to the examples described below unless departing from the scope of the present invention. Further, "part" and "%" are on a mass basis unless otherwise noted.

Further, propylene glycol monomethyl ether acetate is noted as "PGMEA".

<Preparation of Temporary Adhesive Composition>

The following components were mixed with each other to obtain a uniform solution, the obtained solution was filtered using a filter made of polytetrafluoroethylene, having a pore size of 5 μm, and then compositions of the examples and the comparative examples were respectively prepared.

<<Composition of Temporary Adhesive Composition>>

Resin P (temporary adhesive) listed in Table 1 or 2: parts by mass listed in Table 1 or 2

Solvent A listed in Table 1 or 2: parts by mass listed in Table 1 or 2

MEGAFACE F-553 (manufactured by DIC Corporation): 0.5 parts by mass

TABLE 1-1

|  | Resin P | | | | Solvent A | | | | |
|---|---|---|---|---|---|---|---|---|---|
|  | Type | Parts by mass | Type | Parts by mass | Type | Parts by mass | Solvent B | Solvent C | $\|sp_A - sp_B\|$ |
| Example 1 | P-1 | 28.7 | | | S-1 | 70.8 | S-1 | S-1 | 0.0 |
| Example 2 | P-1 | 28.7 | | | S-1 | 70.8 | S-1 | S-2 | 0.0 |
| Example 3 | P-1 | 28.7 | | | S-1 | 70.8 | S-1 | S-3 | 0.0 |
| Example 4 | P-1 | 28.7 | | | S-1 | 70.8 | S-1 | S-4 | 0.0 |
| Example 5 | P-1 | 28.7 | | | S-1 | 70.8 | S-1 | S-5 | 0.0 |
| Example 6 | P-1 | 28.7 | | | S-1 | 70.8 | S-1 | S-6 | 0.0 |
| Example 7 | P-1 | 28.7 | | | S-1 | 70.8 | S-1 | S-7 | 0.0 |
| Example 8 | P-1 | 28.7 | | | S-1 | 70.8 | S-1 | S-8 | 0.0 |
| Example 9 | P-1 | 28.7 | | | S-1 | 70.8 | S-1 | S-9 | 0.0 |
| Example 10 | P-1 | 28.7 | | | S-1 | 70.8 | S-1 | S-10 | 0.0 |
| Example 11 | P-1 | 28.7 | | | S-1 | 70.8 | S-2 | S-1 | 0.1 |
| Example 12 | P-1 | 28.7 | | | S-1 | 70.8 | S-3 | S-1 | 0.0 |
| Example 13 | P-1 | 28.7 | | | S-1 | 70.8 | S-4 | S-1 | 0.2 |
| Example 14 | P-1 | 28.7 | | | S-1 | 70.8 | S-6 | S-1 | 0.4 |
| Example 15 | P-1 | 28.7 | | | S-1 | 70.8 | S-7 | S-1 | 0.8 |
| Example 16 | P-1 | 28.7 | | | S-1 | 70.8 | S-8 | S-1 | 0.8 |
| Example 17 | P-1 | 28.3 | | | S-2 | 71.2 | S-1 | S-1 | 0.1 |
| Example 18 | P-1 | 28.7 | | | S-3 | 70.8 | S-1 | S-1 | 0.0 |
| Example 19 | P-1 | 28.3 | | | S-4 | 71.2 | S-1 | S-1 | 0.2 |
| Example 20 | P-1 | 27.8 | | | S-6 | 71.7 | S-1 | S-1 | 0.4 |
| Example 21 | P-1 | 28.7 | | | S-7 | 70.8 | S-1 | S-1 | 0.8 |
| Example 22 | P-1 | 28.7 | | | S-8 | 70.8 | S-1 | S-1 | 0.8 |
| Example 23 | P-1 | 27.8 | | | S-11 | 71.7 | S-1 | S-1 | 0.0 |
| Example 24 | P-1 | 26.9 | | | S-12 | 72.6 | S-1 | S-1 | 0.2 |
| Example 25 | P-1 | 14.3 | P-3 | 14.3 | S-1 | 70.8 | S-1 | S-1 | 0.0 |
| Example 26 | P-1 | 14.3 | P-4 | 14.3 | S-1 | 70.8 | S-1 | S-1 | 0.0 |
| Example 27 | P-2 | 14.3 | P-3 | 14.3 | S-1 | 70.8 | S-1 | S-1 | 0.0 |
| Example 28 | P-2 | 14.3 | P-4 | 14.3 | S-1 | 70.8 | S-1 | S-1 | 0.0 |
| Example 29 | P-1 | 26.0 | | | S-22 | 73.5 | S-22 | S-22 | 0.0 |
| Example 30 | P-1 | 27.8 | | | S-23 | 71.7 | S-23 | S-23 | 0.0 |
| Example 31 | P-1 | 26.9 | | | S-24 | 72.6 | S-24 | S-24 | 0.0 |
| Example 32 | P-7 | 28.7 | | | S-20 | 70.8 | S-20 | S-20 | 0.0 |
| Example 33 | P-8 | 28.7 | | | S-1 | 70.8 | S-1 | S-1 | 0.0 |
| Example 34 | P-9 | 28.7 | | | S-1 | 70.8 | S-1 | S-1 | 0.0 |
| Example 35 | P-1 | 28.7 | | | S-1 | 70.8 | S-1 | S-1 | 0.0 |
| Example 36 | P-1 | 28.7 | | | S-1 | 70.8 | S-9 | S-1 | 1.8 |
| Example 37 | P-1 | 28.7 | | | S-1 | 70.8 | S-10 | S-1 | 3.3 |

TABLE 1-2

|  | Resin P | | | | Solvent A | | | | |
|---|---|---|---|---|---|---|---|---|---|
|  | Type | Parts by mass | Type | Parts by mass | Type | Parts by mass | Solvent B | Solvent C | $\|sp_A - sp_B\|$ |
| Comparative Example 1 | P-1 | 25.1 | | | S-25 | 74.4 | S-25 | S-25 | 0.0 |
| Comparative Example 2 | P-1 | 26.9 | | | S-10 | 72.6 | S-18 | S-1 | 5.2 |
| Comparative Example 3 | P-1 | 28.7 | | | S-1 | 70.8 | S-18 | S-1 | 1.9 |
| Comparative Example 4 | P-1 | 28.7 | | | S-1 | 70.8 | S-11 | S-1 | 0.0 |
| Comparative Example 5 | P-1 | 28.7 | | | S-1 | 70.8 | S-1 | S-11 | 0.0 |
| Comparative Example 6 | P-1 | 28.7 | | | S-1 | 70.8 | S-1 | S-12 | 0.0 |
| Comparative Example 7 | P-1 | 28.7 | | | S-1 | 70.8 | S-1 | S-13 | 0.0 |
| Comparative Example 8 | P-1 | 25.1 | | | S-13 | 74.4 | S-1 | S-1 | 0.0 |
| Comparative Example 9 | P-1 | 28.7 | | | S-1 | 70.8 | S-1 | S-15 | 0.0 |

TABLE 1-2-continued

|  | Resin P Type | Resin P Parts by mass | Type | Parts by mass | Solvent A Type | Solvent A Parts by mass | Solvent B | Solvent C | $|sp_A - sp_B|$ |
|---|---|---|---|---|---|---|---|---|---|
| Comparative Example 10 | P-1 | 28.7 |  |  | S-1 | 70.8 | S-18 | S-13 | 1.9 |
| Comparative Example 11 | P-1 | 26.4 |  |  | S-15 | 73.1 | S-1 | S-13 | 1.2 |
| Comparative Example 12 | P-1 | 28.7 |  |  | S-3 | 70.8 | S-17 | S-18 | 1.5 |
| Comparative Example 13 | P-1 | 26.9 |  |  | S-10 | 72.6 | S-1 | S-18 | 3.3 |
| Comparative Example 14 | P-1 | 28.7 |  |  | S-1 | 70.8 | S-16 | S-1 | 2.0 |
| Comparative Example 15 | P-1 | 27.9 |  |  | S-9 | 71.6 | S-15 | S-1 | 3.0 |
| Comparative Example 16 | P-5 | 24.2 |  |  | S-14 | 75.3 | S-14 | S-14 | 0.0 |
| Comparative Example 17 | P-6 | 21.5 |  |  | S-19 | 78.0 | S-19 | S-19 | 0.0 |
| Comparative Example 18 | P-7 | 34.0 |  |  | S-21 | 65.5 | S-21 | S-21 | 0.0 |

The value of $|sp_A - sp_B|$ in the tables above indicates a difference between the solubility parameter of the solvent A and the solubility parameter of the solvent B and is a value calculated from the solubility parameters of respective solutions listed in Table 3 described below.

The resin P listed in Table 1 or 2 is as follows.

<Resin P>

TABLE 2

| Resin P | Trade name | Manufacturer |
|---|---|---|
| P-1 | SEPTON 2104 | Kuraray Co., Ltd. |
| P-2 | TUFTEC P2000 | Asahi Kasei Corporation |
| P-3 | SEPTON 4033 | Kuraray Co., Ltd. |
| P-4 | KRATON G1652MU | Kraton Corporation |
| P-5 | PCZ-300 | Mitsubishi Gas Chemical Company, Inc. |
| P-6 | Ultrason E6020P | BASF Japan Ltd. |
| P-7 | ESTYREN MS-200 | NIPPON STEEL & SUMIKIN CHEMICAL CO., LTD. |
| P-8 | HYTREL 3046 | DU PONT-TORAY CO., LTD. |
| P-9 | ASAPRENE T-432 | Asahi Kasei Corporation |

The solvents A to C listed in Table 1 or 2 are as follows.

<Solvent>

TABLE 3

|  | Solvent Trade name | Manufacturers | sp value | Vapor pressure P | 10 logP | Saturated solubility C Resin | Saturated solubility C (25° C.) | Formula (1) | Formula (2) | Formula (3) | Boiling point |
|---|---|---|---|---|---|---|---|---|---|---|---|
| S-1 | Mesitylene | Toyo Gosei Co., Ltd. | 18.0 | 330 | 25.2 | P-1 | 32 | 3.5 | 3.9 | 4.8 | 165 |
| S-1 | Mesitylene | Toyo Gosei Co., Ltd. | 18.0 | 330 | 25.2 | P-8 | 28 | 7.2 | 4.9 | 6.3 | 165 |
| S-1 | Mesitylene | Toyo Gosei Co., Ltd. | 18.0 | 330 | 25.2 | P-9 | 28.5 | 6.7 | 4.6 | 6.0 | 165 |
| S-1 | Mesitylene | Toyo Gosei Co., Ltd. | 18.0 | 330 | 25.2 | P-1/P-3 = 50/50 | 28 | 7.2 | 4.9 | 6.3 | 165 |
| S-1 | Mesitylene | Toyo Gosei Co., Ltd. | 18.0 | 330 | 25.2 | P-1/P-4 = 50/50 | 29 | 6.3 | 4.3 | 5.7 | 165 |
| S-1 | Mesitylene | Toyo Gosei Co., Ltd. | 18.0 | 330 | 25.2 | P-2/P-3 = 50/50 | 29 | 6.3 | 4.3 | 5.7 | 165 |
| S-1 | Mesitylene | Toyo Gosei Co., Ltd. | 18.0 | 330 | 25.2 | P-2/P-4 = 50/50 | 30 | 5.3 | 3.9 | 5.2 | 165 |
| S-2 | t-butylbenzene | Toyo Gosei Co., Ltd. | 18.1 | 293 | 24.7 | P-1 | 31.6 | 4.1 | 4.4 | 5.3 | 169 |
| S-3 | Pseudocumen | Toyo Gosei Co., Ltd. | 18.1 | 302 | 24.8 | P-1 | 32 | 3.7 | 4.3 | 5.2 | 169 |
| S-4 | Cumene | KASEIHIN SHOJI CO., LTD. | 18.2 | 600 | 27.8 | P-1 | 31.6 | 3.5 | 1.4 | 2.3 | 152 |
| S-5 | s-butylbenzene | Tokyo Chemical Industry Co., Ltd. | 18.1 | 233 | 23.7 | P-1 | 31 | 5.2 | 5.3 | 6.4 | 173 |
| S-6 | Isobutylbenzene | Tokyo Chemical Industry Co., Ltd. | 17.6 | 257 | 24.1 | P-1 | 31 | 4.9 | 4.9 | 6.0 | 172 |
| S-7 | 3-ethyltoluene | Tokyo Chemical Industry Co., Ltd. | 17.2 | 405 | 26.1 | P-1 | 32 | 3.1 | 3.1 | 3.9 | 160 |
| S-8 | 4-ethyltoluene | Tokyo Chemical Industry Co., Ltd. | 17.2 | 400 | 26.0 | P-1 | 32 | 3.2 | 3.1 | 4.0 | 161 |
| S-9 | p-cymene | Nippon Terpene Chemicals, Inc. | 19.8 | 270 | 24.3 | P-1 | 31.1 | 4.7 | 4.7 | 5.8 | 177 |
| S-10 | p-menthane | Nippon Terpene Chemicals, Inc. | 14.7 | 359 | 25.6 | P-1 | 30 | 5.2 | 3.6 | 4.9 | 168 |
| S-11 | p-diethylbenzene | Toray Industries, Inc. | 18.0 | 137 | 21.4 | P-1 | 31 | 6.9 | 7.6 | 8.7 | 180 |
| S-12 | d-limonene | Nippon Terpene Chemicals, Inc. | 17.8 | 207 | 23.2 | P-1 | 30 | 6.3 | 5.9 | 7.1 | 176 |
| S-13 | Decahydronaphthalene | NIPPON STEEL & SUMIKIN CHEMICAL CO., LTD. | 18.0 | 307 | 24.9 | P-1 | 28 | 7.3 | 5.1 | 6.5 | 186 |
| S-14 | Anisole | Toyo Gosei Co., Ltd. | 22.4 | 470 | 26.7 | P-2 | 27 | 8.0 | 4.6 | 6.0 | 154 |
| S-15 | Cyclohexane | NIPPON STEEL & SUMIKIN CHEMICAL CO., LTD. | 16.8 | 13100 | 41.2 | P-1 | 29.5 | 15.2 | 12.3 | 11.4 | 81 |
| S-16 | Methylcyclohexane | NIPPON STEEL & SUMIKIN CHEMICAL CO., LTD. | 16.0 | 5730 | 37.6 | P-1 | 29 | 12.2 | 8.8 | 8.2 | 101 |

TABLE 3-continued

| | Solvent | | sp | Vapor | | Saturated solubility C | | Formula (1) | Formula (2) | Formula (3) | Boiling |
|---|---|---|---|---|---|---|---|---|---|---|---|
| | Trade name | Manufacturers | value | pressure P | 10 logP | Resin | C (25° C.) | | | | point |
| S-17 | Ethylcyclo-hexane | NIPPON STEEL & SUMIKIN CHEMICAL CO., LTD. | 16.6 | 1707 | 32.3 | P-1 | 28.5 | 8.4 | 4.2 | 4.2 | 132 |
| S-18 | Tetrahydro-naphthalene | NIPPON STEEL & SUMIKIN CHEMICAL CO., LTD. | 19.9 | 37 | 15.7 | P-1 | 25.1 | 15.0 | 14.6 | 15.9 | 207 |
| S-19 | N-ethyl-2-pyrrolidone | MARUZEN CHEMICAL TRADING CO, LTD. | 22.5 | 1667 | 32.2 | P-3 | 24 | 12.2 | 7.7 | 8.3 | 212 |
| S-20 | PGMEA | SANKYO CHEMICAL INDUSTRY Co., Ltd. | 18.4 | 522 | 27.2 | P-4 | 32 | 3.0 | 2.1 | 2.8 | 146 |
| S-21 | 2-heptanone | KH Neochem Co., Ltd. | 17.4 | 270 | 24.3 | P-4 | 38 | 4.0 | 8.4 | 8.3 | 150 |
| S-22 | Mixed solvent A | — | 16.4 | 345 | 25.4 | P-1 | 29 | 6.2 | 4.1 | 5.5 | 167 |
| S-23 | Mixed solvent B | — | 17.6 | 1410 | 31.5 | P-1 | 31 | 6.0 | 2.5 | 1.8 | 152 |
| S-24 | Mixed solvent C | — | 18.0 | 276 | 24.4 | P-1 | 30 | 5.6 | 4.7 | 5.9 | 170 |
| S-25 | Mixed solvent D | — | 17.6 | 1392 | 31.4 | P-1 | 28 | 8.3 | 3.9 | 4.2 | 169 |

The mixed solvent A is obtained by mixing mesitylene and p-mentane at a mass ratio of 50:50, the mixed solvent B is obtained by mixing mesitylene and methylcyclohexane at a mass ratio of 80:20, the mixed solvent C is obtained by mixing t-butylbenzene and d-limonene at a mass ratio of 80:20, and the mixed solvent D is obtained by mixing methylcyclohexane and decahydronaphthalene at a mass ratio of 20:80.

In the table above, the sp value indicates an sp value of a solvent and the unit thereof is $(MPa)^{0.5}$. The sp value is a value calculated according to the method described above.

The vapor pressure P indicates a vapor pressure of a solvent at 25° C. and unit thereof is Pa. The vapor pressure P is a value measured according to a static method.

The saturated solubility C indicates a saturated solubility of a solvent at 25° C. and the unit thereof is % by mass. The saturated solubility C is a concentration obtained when the solution does not fall down when the top and the bottom of a 30 mL sample bottle are inverted after 20 mL of each solvent has been poured into the sample bottle to dissolve a resin.

The boiling point indicates a boiling point of a solvent and the unit thereof is ° C.

The value in Formula 1, the value in Formula 2, and the value in Formula 3 indicate values on the left side of Formulae 1 to 3 and the respective values indicate the values represented by the following formulae.

$$\sqrt{(C_A-35)^2+(10\log P_A-27)^2}<73 \quad \text{Formula 1}$$

$$\sqrt{(C_B-31)^2+(10\log P_B-29)^2}<5.0 \quad \text{Formula 2}$$

$$\sqrt{(C_C-32)^2+(10\log P_C-30)^2}<6.5 \quad \text{Formula 3}$$

<Formation of Temporary Adhesive Layer and Washing of Excessive Amount of Temporary Adhesive (Examples 1 to 32 and 34 to 37 and Comparative Examples 1 to 18)>15 mL of the temporary adhesive composition containing the solvent A and the resin P (temporary adhesive) listed in Table 1 or 2 was added dropwise to the surface of the silicon wafer (first wafer) provided with a plurality of bumps and having a diameter of 8 inches (1 inch corresponds to 2.54 cm) for 30 seconds while rotating the silicon wafer at 50 rpm using a spin coater (MS-A300, manufactured by MIKASA CO., LTD.). Next, the rotation speed was increased to 600 rpm and then the state was held for 30 seconds. Thereafter, the solvent B was supplied to the outer peripheral portion (the edge portion and the bevel portion) of the first wafer and the rear surface of the first wafer for 40 seconds while rotating the first wafer, and then the temporary adhesive composition attached to the outer peripheral portion of the first wafer and the surface (rear surface) on a side where the temporary adhesive composition of the first wafer was not added dropwise to was washed. The wafer was heated at 110° C. for 3 minutes and further heated at 190° C. for 3 minutes using a hot plate, thereby obtaining an adhesive support 100 in which the temporary adhesive layer was formed on the surface of the first wafer. As a result of measurement of the contents of the solvent A and the solvent B contained in the temporary adhesive layers of Examples 1 to 32 and 34 to 37 using a thermal analyzer (TG-MS (manufactured by PerkinElmer, Inc.)) including a built-in mass spectrometer, all contents were in a range of 0.000001% to 0.1% by mass.

<Preparation of Laminate 1>

One more silicon wafer (second wafer) having a diameter of 8 inches was crimped to the surface of the adhesive support 100 on a side where the temporary adhesive film was formed in a vacuum under a temperature condition of 190° C. at a pressure of 0.51 MPa for 3 minutes using a wafer bonder (EVG 520IS, manufactured by EV Group), thereby obtaining a laminate 1.

<Peeling of Silicon Wafer from Laminate 1>

The silicon wafer was peeled off from the laminate 1 by fixing the first wafer of the laminate 1 and then pulling the second wafer up to the direction perpendicular to the substrate surface of the second wafer at a speed of 50 mm/min using wafer bonder (EVG 805, manufactured by EV Group). The peeling was performed at a temperature of 25° C.

<Washing of Remaining Temporary Adhesive>

The temporary adhesive layer was washed by spraying the solvent C listed in Table 1 or 2 to the temporary adhesive layer for 120 seconds while rotating the second wafer at 200 rpm using a developing device (AD-3000, manufactured by MIKASA CO., LTD.).

<Formation of Temporary Adhesive Layer and Washing of Excessive Amount of Temporary Adhesive (Example 33)>

The evaluation of the laminate was performed in the same manner as described above except that a glass wafer (EN-A1, manufactured by ASAHI GLASS CO., LTD.) was used as the second wafer in Example 1. As a result of measurement of the contents of the solvent A and the solvent B contained in the temporary adhesive layer of Example 33 using a thermal analyzer (TG-MS (manufactured by PerkinElmer, Inc.)) including a built-in mass spectrometer, both contents were in a range of 0.000001% to 0.1% by mass.

<Evaluation>

<<Evaluation of Residues of Temporary Adhesive>>

Residues derived from the temporary adhesive of the first wafer were observed using an optical microscope and the evaluation was performed based on the following standard. The observation was performed such that each site, at an area of 1 mm², of the front surface (on the side provided with a plurality of bumps) and the bevel portion and the rear surface (on the side opposite to the front surface) of the first wafer was observed 20 times and the evaluation was performed using the average number of particles derived from the temporary adhesive. In a case where the diameter when a particle was not spherical, a diameter obtained by converting the particle into a sphere having the same mass as the mass of the particle was used.

A: The average number of particles respectively having a diameter of 5 μm or greater on the front surface and the bevel portion and the rear surface of the first wafer was less than 5 particles/mm².

B: The average number of particles respectively having a diameter of 5 μm or greater on the front surface and the bevel portion and the rear surface of the first wafer was 5 particles/mm² or greater and less than 15 particles/mm².

C: The average number of particles respectively having a diameter of 5 μm or greater on the front surface and the bevel portion and the rear surface of the first wafer was 15 particles/mm² or greater and less than 30 particles/mm².

D: The average number of particles respectively having a diameter of 5 μm or greater on the front surface and the bevel portion and the rear surface of the first wafer was 30 particles/mm² or greater.

The results are listed in the following tables.

TABLE 4-1

|  | Solvent A | Solvent B | Solvent C | Residues |
|---|---|---|---|---|
| Example 1 | S-1 | S-1 | S-1 | A |
| Example 2 | S-1 | S-1 | S-2 | A |
| Example 3 | S-1 | S-1 | S-3 | A |
| Example 4 | S-1 | S-1 | S-4 | A |
| Example 5 | S-1 | S-1 | S-5 | A |
| Example 6 | S-1 | S-1 | S-6 | A |
| Example 7 | S-1 | S-1 | S-7 | A |
| Example 8 | S-1 | S-1 | S-8 | A |
| Example 9 | S-1 | S-1 | S-9 | A |
| Example 10 | S-1 | S-1 | S-10 | A |
| Example 11 | S-1 | S-2 | S-1 | A |
| Example 12 | S-1 | S-3 | S-1 | A |
| Example 13 | S-1 | S-4 | S-1 | A |
| Example 14 | S-1 | S-6 | S-1 | A |
| Example 15 | S-1 | S-7 | S-1 | B |
| Example 16 | S-1 | S-8 | S-1 | B |
| Example 17 | S-2 | S-1 | S-1 | A |
| Example 18 | S-3 | S-1 | S-1 | A |
| Example 19 | S-4 | S-1 | S-1 | A |
| Example 20 | S-6 | S-1 | S-1 | A |
| Example 21 | S-7 | S-1 | S-1 | B |
| Example 22 | S-8 | S-1 | S-1 | B |
| Example 23 | S-11 | S-1 | S-1 | B |
| Example 24 | S-12 | S-1 | S-1 | B |
| Example 25 | S-1 | S-1 | S-1 | A |
| Example 26 | S-1 | S-1 | S-1 | A |
| Example 27 | S-1 | S-1 | S-1 | A |
| Example 28 | S-1 | S-1 | S-1 | A |
| Example 29 | S-22 | S-22 | S-22 | A |
| Example 30 | S-23 | S-23 | S-23 | A |
| Example 31 | S-24 | S-24 | S-24 | A |
| Example 32 | S-20 | S-20 | S-20 | B |
| Example 33 | S-1 | S-1 | S-1 | B |
| Example 34 | S-1 | S-1 | S-1 | B |
| Example 35 | S-1 | S-1 | S-1 | A |
| Example 36 | S-1 | S-9 | S-1 | B |
| Example 37 | S-1 | S-10 | S-1 | B |

TABLE 4-2

|  | Solvent A | Solvent B | Solvent C | Residues |
|---|---|---|---|---|
| Comparative Example 1 | S-25 | S-25 | S-25 | C |
| Comparative Example 2 | S-10 | S-18 | S-1 | D |
| Comparative Example 3 | S-1 | S-18 | S-1 | C |
| Comparative Example 4 | S-1 | S-11 | S-1 | C |
| Comparative Example 5 | S-1 | S-1 | S-11 | C |
| Comparative Example 6 | S-1 | S-1 | S-12 | C |
| Comparative Example 7 | S-1 | S-1 | S-13 | C |
| Comparative Example 8 | S-13 | S-1 | S-1 | C |
| Comparative Example 9 | S-1 | S-1 | S-15 | C |
| Comparative Example 10 | S-1 | S-18 | S-13 | C |
| Comparative Example 11 | S-15 | S-1 | S-13 | C |
| Comparative Example 12 | S-3 | S-17 | S-18 | C |
| Comparative Example 13 | S-10 | S-1 | S-18 | D |
| Comparative Example 14 | S-1 | S-16 | S-1 | C |
| Comparative Example 15 | S-9 | S-15 | S-1 | D |
| Comparative Example 16 | S-14 | S-14 | S-14 | C |
| Comparative Example 17 | S-19 | S-19 | S-19 | C |
| Comparative Example 18 | S-21 | S-21 | S-21 | C |

As evident from the results described above, in a case where the kit of the present invention was used, a device substrate with fewer residues derived from the temporary adhesive was obtained. On the contrary, in a case where the kit of the present invention was not used, residues derived from the temporary adhesive were largely generated on a device substrate.

EXPLANATION OF REFERENCES

11: temporary adhesive layer

12: first substrate

60: second substrate

60a: thinned second substrate

61: silicon substrate

61a: surface

61b, 61b1: rear surface

62: device chip

100: adhesive support

What is claimed is:

1. A kit for manufacturing a semiconductor device comprising:

a composition which contains a solvent A;

a composition which contains a solvent B; and a composition which contains a solvent C, wherein the kit is used when a temporary adhesive layer is formed on a first substrate using a temporary adhesive composition containing a temporary adhesive and the solvent A, the composition containing the solvent A is the temporary adhesive composition containing the temporary adhesive and the solvent A, at least some of an excessive amount of the temporary adhesive on the first substrate is washed using the composition containing the solvent B, a laminate is manufactured by bonding the first substrate and a second substrate through the temporary adhesive layer, one of the first substrate and the second substrate is peeled off from the laminate at a temperature of lower than 40° C., and then the temporary adhesive remaining on at least one of the first substrate and the second substrate is washed using the composition containing the solvent C, and the solvent A satisfies Formula 1, the solvent B satisfies Formula 2, and the solvent C satisfies Formula 3, $$\sqrt{(C_A-35)^2+(10\log P_A-27)^2} < 7.3 \quad \text{Formula 1}$$

$$\sqrt{(C_B-31)^2+(10\log P_B-29)^2} < 5.0 \quad \text{Formula 2}$$

$$\sqrt{(C_C-32)^2+(10\log P_C-30)^2} < 6.5 \quad \text{Formula 3}$$

in Formulae 1 to 3, $P_A$, $P_B$, and $P_C$ each represent a vapor pressure of the solvent A, the solvent B, and the solvent C at 25° C., and $C_A$, $C_B$, and $C_C$ each represent a saturated solubility of the temporary adhesive in the solvent A, the solvent B, and the solvent C at 25° C., where the unit of the vapor pressure is Pa and the unit of the saturated solubility is % by mass.

2. The kit according to claim 1, wherein when a solubility parameter of the solvent A is set as $sp_A$ and a solubility parameter of the solvent B is set as $sp_B$, an in equation of $|sp_A - sp_B| \leq 3.0$ is satisfied, where the unit of the solubility parameter is $(MPa)^{0.5}$.

3. The kit according to claim 1, wherein the laminate includes one or more temporary adhesive layers on the surface of the first substrate and the second substrate on the surface of the temporary adhesive layer.

4. The kit according to claim 3, wherein the temporary adhesive layer is formed of one layer.

5. The kit according to claim 1, wherein the temporary adhesive layer is formed by coating the first substrate with a temporary adhesive composition that contains the temporary adhesive and the solvent A.

6. The kit according to claim 1, wherein an excessive amount of the temporary adhesive in the laminate is present on at least one of an edge portion of the first substrate and a bevel portion of the first substrate, which is a surface of the first substrate on a side far from the second substrate.

7. The kit according to claim 1, wherein the temporary adhesive contains an elastomer.

8. The kit according to claim 7, wherein the elastomer has a repeating unit derived from styrene.

9. The kit according to claim 7, wherein the elastomer is a hydrogenated material.

10. The kit according to a claim 7, wherein the elastomer has a styrene block at one terminal or both terminals.

11. The kit according to claim 1, wherein a saturated solubility $C_C$ of the solvent C at 25° C. is in a range of 26 to 35% by mass.

12. The kit according to claim 1, wherein the solvent A, the solvent B, and the solvent C respectively include hydrocarbons having at least one of an alicycle and an aromatic ring.

13. The kit according to claim 1, wherein a boiling point of each of the solvents A to C at 101300 Pa is in a range of 155° C. to 206° C.

14. The kit according to claim 1, wherein 90% by mass or greater of the composition containing the solvent A is formed of the solvent A.

15. The kit according to claim 1, wherein 90% by mass or greater of the composition containing the solvent B is formed of the solvent B, and 90% by mass or greater of the composition containing the solvent C is formed of the solvent C.

* * * * *